United States Patent
Nightingale

(10) Patent No.: US 7,627,462 B2
(45) Date of Patent: Dec. 1, 2009

(54) HARDWARE SIMULATION USING A TEST SCENARIO MANAGER

(75) Inventor: Andrew Mark Nightingale, Cambridge (GB)

(73) Assignee: ARM Limited, Cambridge (GB)

( * ) Notice: Subject to any disclaimer, the term of this patent is extended or adjusted under 35 U.S.C. 154(b) by 1400 days.

(21) Appl. No.: 09/994,023

(22) Filed: Nov. 27, 2001

(65) Prior Publication Data

US 2003/0101040 A1   May 29, 2003

(51) Int. Cl.
    G06F 17/50    (2006.01)
(52) U.S. Cl. .......................................... 703/14; 703/20
(58) Field of Classification Search .................. 703/14, 703/20
    See application file for complete search history.

(56) References Cited

U.S. PATENT DOCUMENTS

| | | | |
|---|---|---|---|
| 5,710,934 | A | 1/1998 | Bona et al. |
| 5,991,533 | A | 11/1999 | Sano et al. |
| 6,002,861 | A | 12/1999 | Butts et al. |
| 6,006,028 | A | 12/1999 | Aharon et al. |
| 6,134,516 | A | 10/2000 | Wang et al. |
| 6,295,623 | B1 | 9/2001 | Lesmeister et al. |
| 6,678,645 | B1 * | 1/2004 | Rajsuman et al. ............. 703/20 |
| 2001/0042226 | A1 | 11/2001 | Dzoba et al. |
| 2002/0002698 | A1 | 1/2002 | Hekmatpour |
| 2002/0019969 | A1 | 2/2002 | Hellestrand et al. |
| 2002/0040288 | A1 | 4/2002 | Yamoto et al. |
| 2002/0042897 | A1 | 4/2002 | Klein et al. |
| 2003/0182642 | A1 | 9/2003 | Schubert et al. |
| 2005/0076314 | A1 | 4/2005 | Matsui et al. |
| 2005/0100032 | A1 | 5/2005 | Patiejunas |
| 2005/0125754 | A1 | 6/2005 | Schubert et al. |
| 2005/0143630 | A1 | 6/2005 | Darby et al. |
| 2005/0143968 | A9 | 6/2005 | Odom et al. |
| 2005/0144577 | A1 | 6/2005 | Devins et al. |
| 2005/0149898 | A1 | 7/2005 | Hakewill et al. |
| 2005/0193280 | A1 | 9/2005 | Schubert et al. |

OTHER PUBLICATIONS

"Towards Design And Validation Of Mixed-Technology SOCs", S. Mir , B. Chariot , G. Nicolescu , R Coste , E Parrain , N. Zergainoh, B. Courtois , A. Jerraya and M. Rencz. 2000.*
"An Efficient Architecture Model for Systematic Design of Application-Specific Multiprocessor SoC". Amer Baghdadi Damien Lyonnard Nacer-E. Zergainoh Ahmed A. Jerraya. 2001.*
"Nuts and Bolts of Core and SoC Verification". Ken Albin. 2001.*

* cited by examiner

Primary Examiner—Kamini Shah
Assistant Examiner—Saif Alhija
(74) Attorney, Agent, or Firm—Nixon & Vanderhye P.C.

(57) ABSTRACT

A hardware simulation and validation system is provided using a plurality of signal interface controllers to exchange stimulus and response signals with a hardware simulation. The action of the signal interface controllers is coordinated by a test scenario manager which exchanges test scenario controlling messages with the signal interface controllers. The test scenario controlling messages specify simulation actions to be performed and when those simulation actions are to be performed.

27 Claims, 7 Drawing Sheets

HARDWARE SIMULATION USING A TEST SCENARIO MANAGER

BACKGROUND OF THE INVENTION

1. Field of the Invention

This invention relates to the field of data processing systems. More particularly, this invention relates to the field of simulating data processing operations performed by data processing systems as part of verifying or testing the design of those data processing systems.

2. Description of the Prior Art

The ability to effectively and efficiently test and/or validate designs is becoming increasingly important. Typical data processing system designs are rapidly increasing in complexity and furthermore are including circuit blocks designed by a variety of different sources or companies. So called system-on-chip (SoC) designs that integrate a large number of functional elements on a single integrated circuit have strong advantages in terms of cost and performance, but require significant amounts of validation and testing before the designs can be reliably released for manufacture. This validation and testing requirement is becoming a bottleneck in getting new systems into the market place. Consequently, measures that can improve the efficiency and effectiveness of such validation and testing of designs are strongly advantageous.

There are currently 3 approaches that can be used to validate a SoC design:

(a) Build a software model of the design and run the same software when the hardware is complete. The problems here include that the hardware models are not fully represented in software in that there is no hardware feedback loop such that different hardware block models can interact fully.

(b) Build VHDL and/or Verilog (trickboxes) models to plug into the external interfaces of the SoC blocks to provide external stimulus to the SoC. This approach is commonly used but suffers from the problem that the code is not very re-usable, and a large amount of knowledge is required of the operation of each trickbox to create effective tests.

(c) Build models of each of the blocks (eVCs) in the SoC using an HVL (hardware verification language) such as Specman to replace existing hardware blocks in turn, such that the modelled blocks can provide stimulus into the system. Here a problem is that the integrity of the system is compromised as existing blocks need to be removed and re-inserted per test.

SUMMARY OF THE INVENTION

Viewed from one aspect the present invention provides apparatus for simulating data processing operations performed by a data processing apparatus, said apparatus comprising:

a hardware simulator responsive to one or more stimulus signals to generate one or more response signals simulating a response of said data processing apparatus to said one or more stimulus signals if applied to said data processing apparatus;

a plurality of signal interface controllers coupled to said hardware simulator, each signal interface controller serving to perform one or more simulation actions transferring at least one of one or more stimulus signals and one or more response signals between a corresponding portion of said hardware simulator and said signal interface controller as part of simulating said data processing operations; and a test scenario manager coupled to said plurality of signal interface controllers and operable to transfer test scenario controlling messages to said plurality of signal interface controllers, at least one of said test scenario controlling messages including:

(i) data defining a simulation action to be performed by a signal interface controller; and (ii) data defining when said signal interface controller should perform said simulated action.

The technique of the present invention provides a structured environment within which complicated hardware designs may be effectively validated and tested. A plurality of signal interface controllers are connected to the simulation of the hardware being tested and are responsible for performing simulation actions upon that hardware by applying stimulus signals or reading response signals from the simulation. At a higher level of abstraction, a test scenario manager is provided which co-ordinates the action of the plurality of signal interface controllers by sending them test scenario controlling messages that specify the simulation actions to be performed and when those simulation actions are to be performed. This approach allows the signal interface controllers to be readily reused across multiple designs to be tested providing those designs have the relevant portions of the interface to which those signal interface controllers relate. The test scenario manager allows complex and realistic tests to be run by relatively simply specifying simulation actions to be performed in a particular sequence and relying upon the re-usable signal interface controllers to transform the abstractly specified simulation actions into the required detailed level of stimulus signals and response signals. This design testing and validation is achieved without the need to modify the hardware simulation itself to include special elements devoted to the testing and validation task since the signal interface controllers can be provided external of the hardware simulation. Thus, a more realistic test of the design is made and that design can proceed unaltered if it passes the tests without the need to remove any special purpose testing elements that might invalidate the testing and checking that had just been performed. The test scenario controlling messages as well as specifying the simulation action to be performed also specify when that simulation action should be performed. This allows sophisticated and realistic sequences of interdependent actions to be built up.

It will be appreciated that the test scenario controlling messages could specify when a simulation action is to be performed in a variety of different ways. However, preferred embodiments specify this information as a time value, a delay value, or as that the action should be performed when a specified other event has occurred. This combination of possibilities allows a wide variety of sophisticated interrelationships between simulation actions to be built up whilst keeping the control and communication overhead down.

Particularly preferred embodiments of the invention also provide a shared data memory associated with the test scenario manager into which signal interface controllers can write data. This data in the shared data memory can be read by the test scenario manager itself or by another signal interface controller. This shared data memory approach allows a signal interface controller to provide feedback, such as trace results, including error messages and observed responses, as well as allowing further signal interface controllers to read data written by another signal interface controller and then respond to that data. Such a feedback via the shared data memory could for example be used to allow one signal interface controller to record the data value it had applied to the hardware simulation and then allow another signal interface controller to read that applied data value and check that the response observed by that other signal interface controller matched the data value that had previously been applied. This is a valuable and powerful technique suitable for point-to-point validation testing operations.

It will be appreciated that the hardware simulation could be provided in a variety of different ways. If a particularly high performance simulation is required, then the hardware simulation could be provided by special purpose programmable hardware elements conducting a simulation coordinated and controlled by the test scenario manager and signal interface controllers of the present technique. However, the invention is particularly well suited to embodiments in which the hardware simulation is provided by software running upon a general purpose computer. Such environments are well suited to providing appropriate co-ordination and interaction between the test scenario manager, signal interface controller and hardware simulation itself.

It will be appreciated that the signal interface controller could be provided in a variety of different forms. However, the modularity and reusability of the signal interface controllers and the mechanisms for interacting with these signal interface controllers are enhanced in preferred embodiments in which the signal interface controller includes an action queue of simulation actions to be performed. The queuing of simulation actions to be performed is a simple and convenient way to allow simulation actions to be commanded by the test scenario manager across the whole simulation system concerned and then queued within the individual signal interface controllers until an appropriate simulation time is reached at which that simulation action should be triggered.

Preferred embodiments also include a scenario manager interface to enable exchange of test scenario controlling messages with the test scenario manager. The provision of such a separate interface facilitates design re-use.

It will be appreciated that each signal interface controller may have significantly differing requirements in the way in which it is required to interact with its associated interface upon the hardware simulation. Preferred embodiments of the invention concentrate this special purpose configuration within a peripheral interface portion of the signal interface controller. This facilitates the ready reuse of the other portions of the signal interface controller and allows the producer of a new signal interface controller to concentrate on the specifics of the peculiarities of that particular signal interface controller.

The abstraction of the control of the scenario being simulated to a sequence of simulated action allows preferred embodiments of this invention to utilise machine generated sequences of such simulated actions. Machine generating such sequences allows a thorough, efficient and relatively quick way of extensively testing and validating a design by exploring a large number of different operational conditions.

Preferred embodiments of the invention manage communication between the test scenario manager and the signal interface controllers by using a master slave relationship.

Other aspects of the invention also provide a method of simulating data processing operations performed by a data processing apparatus and a computer program product for controlling a computer to simulate data processing operations performed by a data processing apparatus.

The above, and other objects, features and advantages of this invention will be apparent from the following detailed description of illustrative embodiments which is to be read in connection with the accompanying drawings.

DESCRIPTION OF THE PREFERRED EMBODIMENTS

Figure 1:
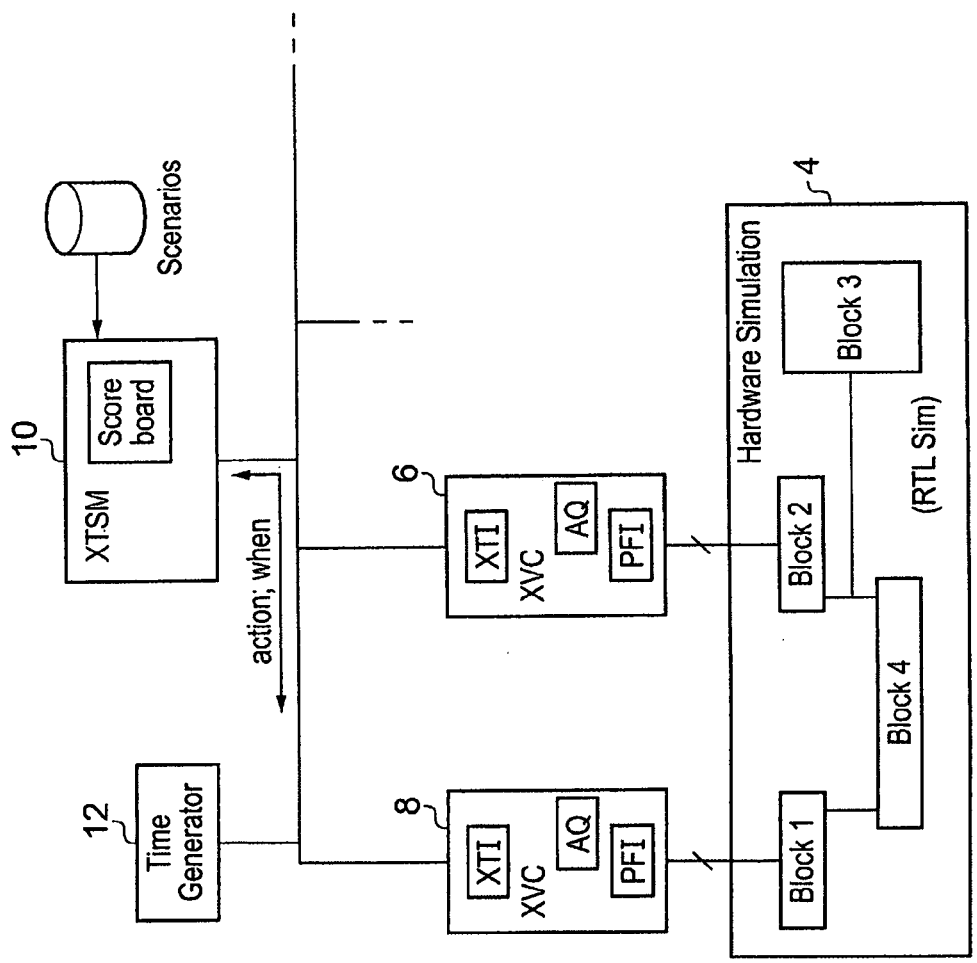
FIG. 1 schematically illustrates a simulation system for validating a hardware design.

FIG. 1 illustrates a simulation system 2 formed of a hardware simulation 4, a plurality of signal interface controllers 6, 8 and a test scenario manager 10. The hardware simulation 4 represents a system-on-chip design of an integrated circuit modelled as RTL using known software modelling programs. Such software modelling programs given RTL definitions (other types of definition are also possible) of circuit designs are able to simulate the processing activity of those designs by propagating signals throughout the designs and observing responses to those signals. The techniques of hardware simulation using RTL models are well known from commercially available systems and will not be further described in themselves. The hardware simulation 4 is supplied with stimulus signal from and returns response signals to associated signal interface controllers 6, 8 that are also referred to as external verification controllers (XVC). The modular nature of the design being simulated by the hardware simulation allows it to be considered as a plurality of hardware blocks. These hardware blocks typically have their own external interface requirements that do not vary between the different designs in which they are used. Thus, a block within the hardware being simulated and its associated XVC are likely to remain unchanged, or substantially unchanged, between different designs. Thus, by building up a plurality of XVCs from a library of these XVCs, a stimulus and response interface for a whole new design as a whole may be rapidly assembled.

The action of the separate XVCs is coordinated by a test scenario manager 10 (external test scenario manager XTSM). The XTSM 10 is responsive to pre-programmed test scenarios, which are written by a test engineer or machine generated to provide random state coverage, to issue test scenario controlling messages to the various XVCs. These test scenario controlling messages specify simulation actions to be performed by the target XVC as well as specifying when that simulation action should be performed, either as an absolute time value, a delay time value or as a trigger dependent upon a detected other event occurring within the simulation. The simulation actions can take a wide variety of different forms depending upon the hardware block to which that particular XVC relates. Examples of simulated actions might be applying signal values to the appropriate signal interface, reading signal values from the appropriate interface, a combination of the above or other actions.

The test scenario controlling messages are broadcast by the XTSM 10 to all of the XVCs. This broadcast messaging to separately executing processes within a computer system is well suited to the aim of providing a flexible and scalable modelling environment. Each of the test scenario controlling messages may include an XVC ID serving to identify the target XVC for that message. All of the XVCs could examine the broadcast test scenario controlling message and check whether the XVC ID matched their own, but only the XVC to which the test scenario controlling message was properly directed would recognise its own ID and act upon that message.

The XVCs 6, 8 themselves have a plurality of components. More particularly, an external test interface XTI is provided and is responsible for reading broadcast test scenario controlling messages from the XTSM 10 as well as generating its own test scenario controlling messages sent from a XVC back to the XTSM 10 and to the other XVCs reporting events occurring within the simulation as detected or controlled by the XVC originating the message. When a message is received by the XTI of a particular XVC, then should the XVC ID match, the simulation action specified within the message is added to an action queue AQ within that XVC. This queue structure allows complex simulation scenarios to be distributed by the XTSM 10 and acted upon in an ordered and controlled fashion by the appropriate XVCs. A peripheral facing interface PFI is responsible for acting upon simulation actions specified in the action queue AQ and generating the appropriate stimulus signals or reading the appropriate response signals as specified by that action to or from the associated hardware block within the hardware simulation 4.

A time generator 12, which may take the form of an XVC which is not itself directly connected to the hardware simulation 4, serves to generate test scenario controlling messages specifying time defining events to the XTSM 10 and the associated XVCs 6, 8. The time generator 12 could for example be used to generate test scenario controlling messages specifying the occurrence of each clock edge associated with the control clock of the hardware simulation 4.

Figure 2:
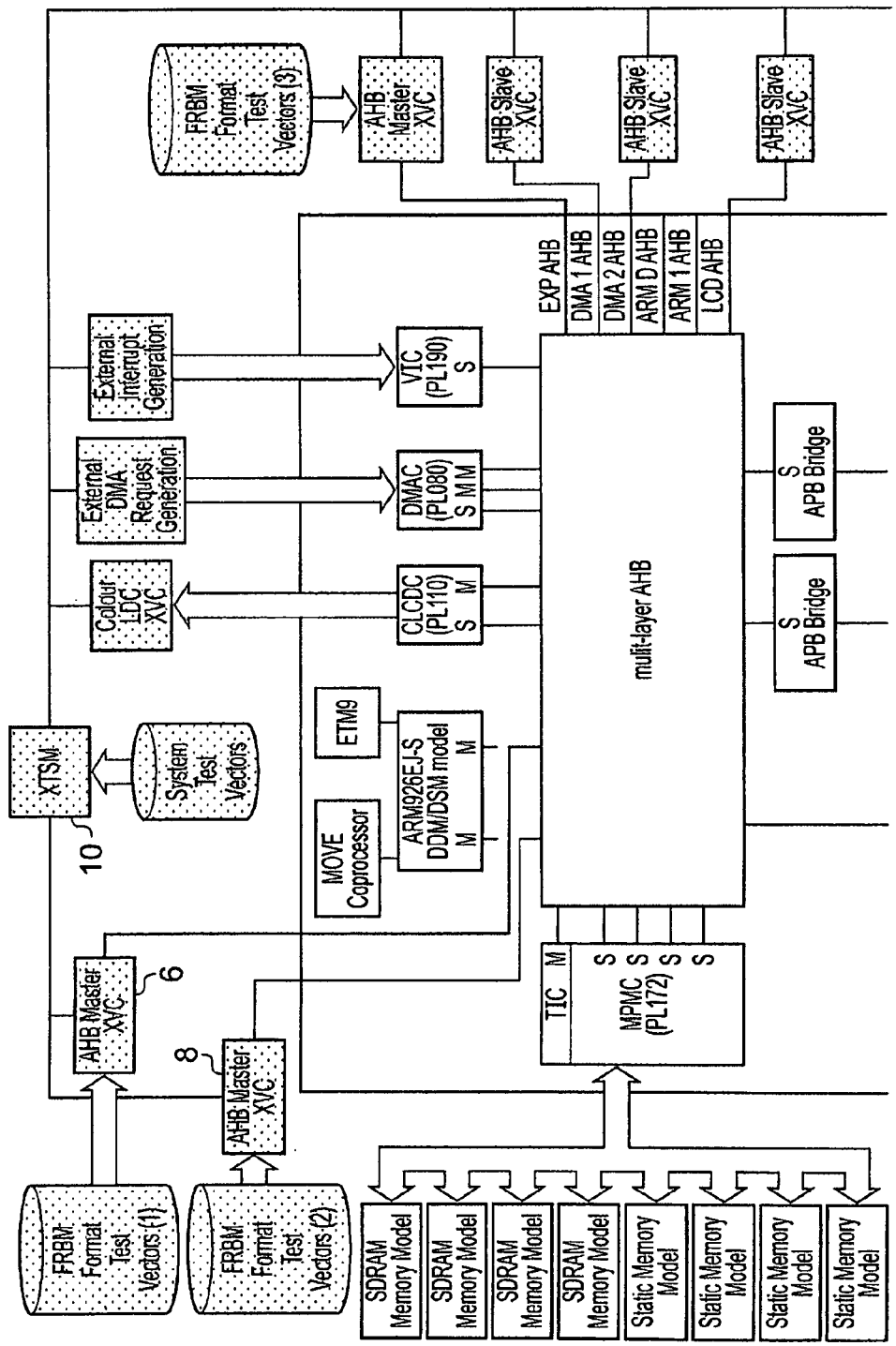
FIGS. 2, 3 and 4 schematically illustrate further examples of hardware designs being validated in accordance with the present techniques.
Figure 2:
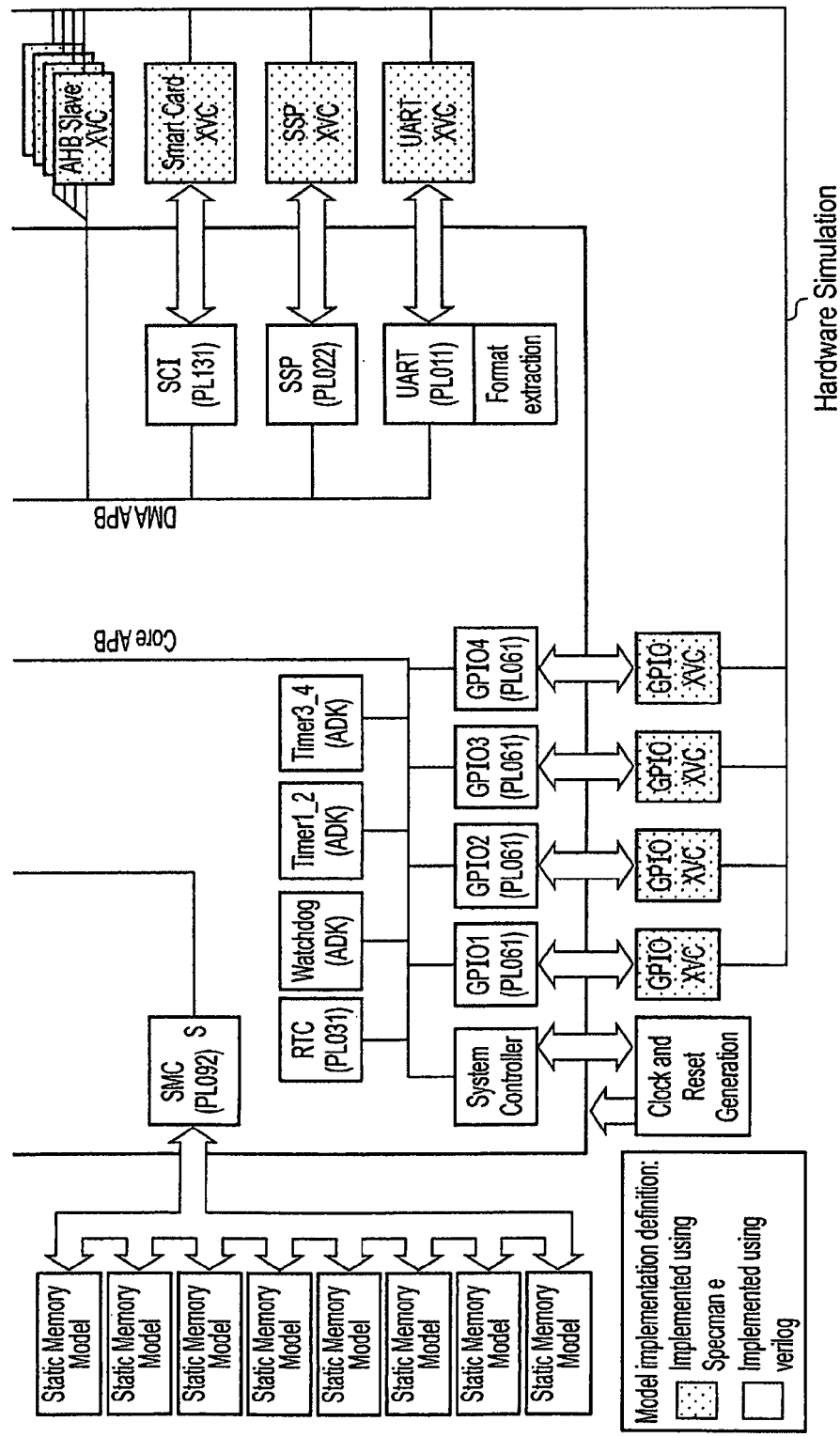

FIG. 2 schematically illustrates a more complex system that is being simulated, validated and tested. In this example, a large number of XVCs are provided each associated with different hardware blocks within the hardware being simulated. The hardware being simulated contains a microprocessor core. Due to the complexity and speed difficulties in simulating the actions of a microprocessor core, this embodiment instead reads pre-generated test vectors simulating the interaction of the microprocessor core with the other elements of the model and applies these test vectors to the appropriate bus such that the other elements within the hardware simulation can respond to those test vectors as if they had been generated by the processor core.

Figure 3:
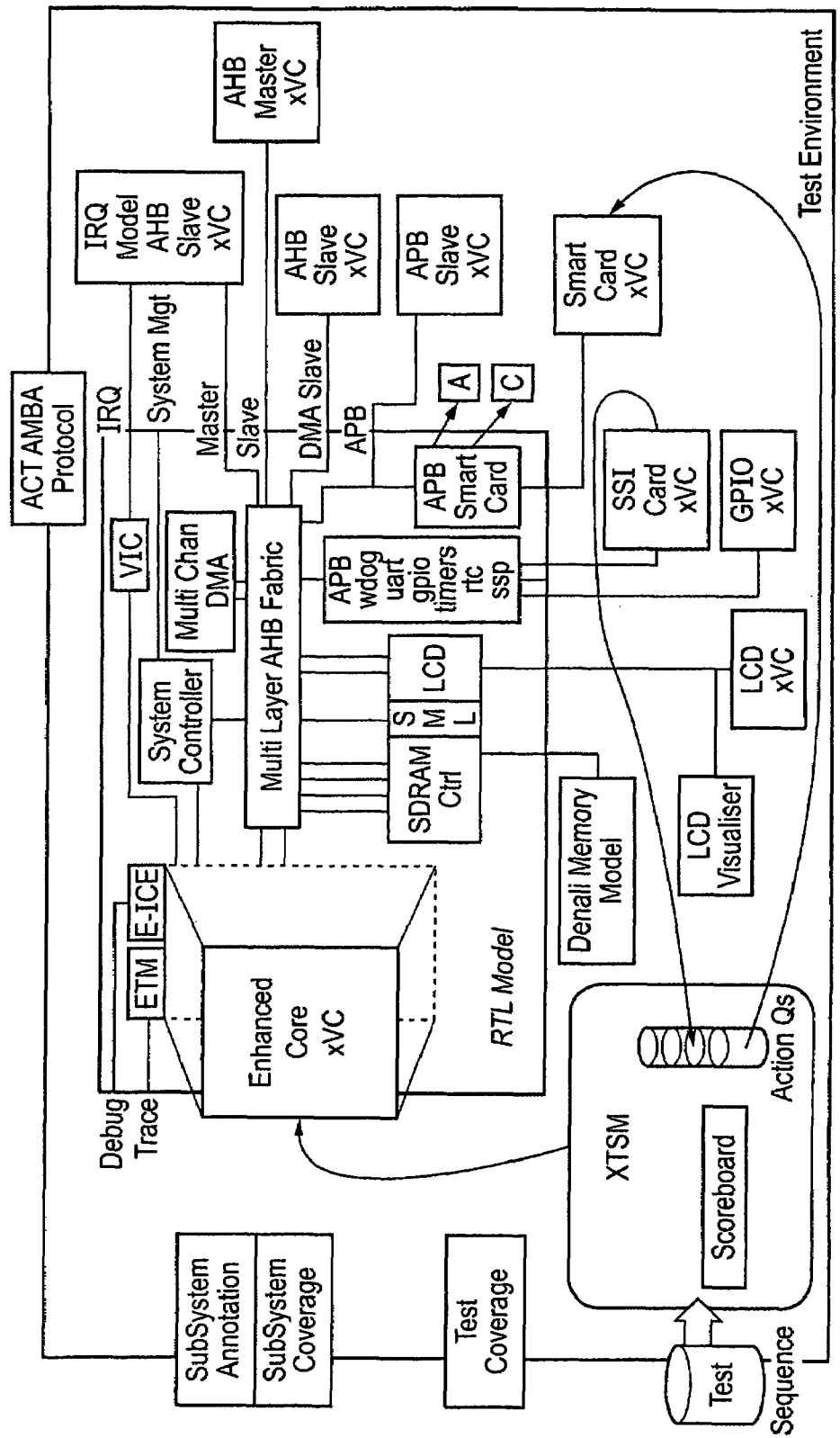

FIG. 3 schematically illustrates another hardware simulation example. This example is similar to that of FIG. 2 except that the microprocessor core is in this case provided by an XVC in itself. The XVC can serve to model the signals produced by the core in response to simulation actions, such as the execution of specified instructions, as controlled by the XTSM.

Figure 4:
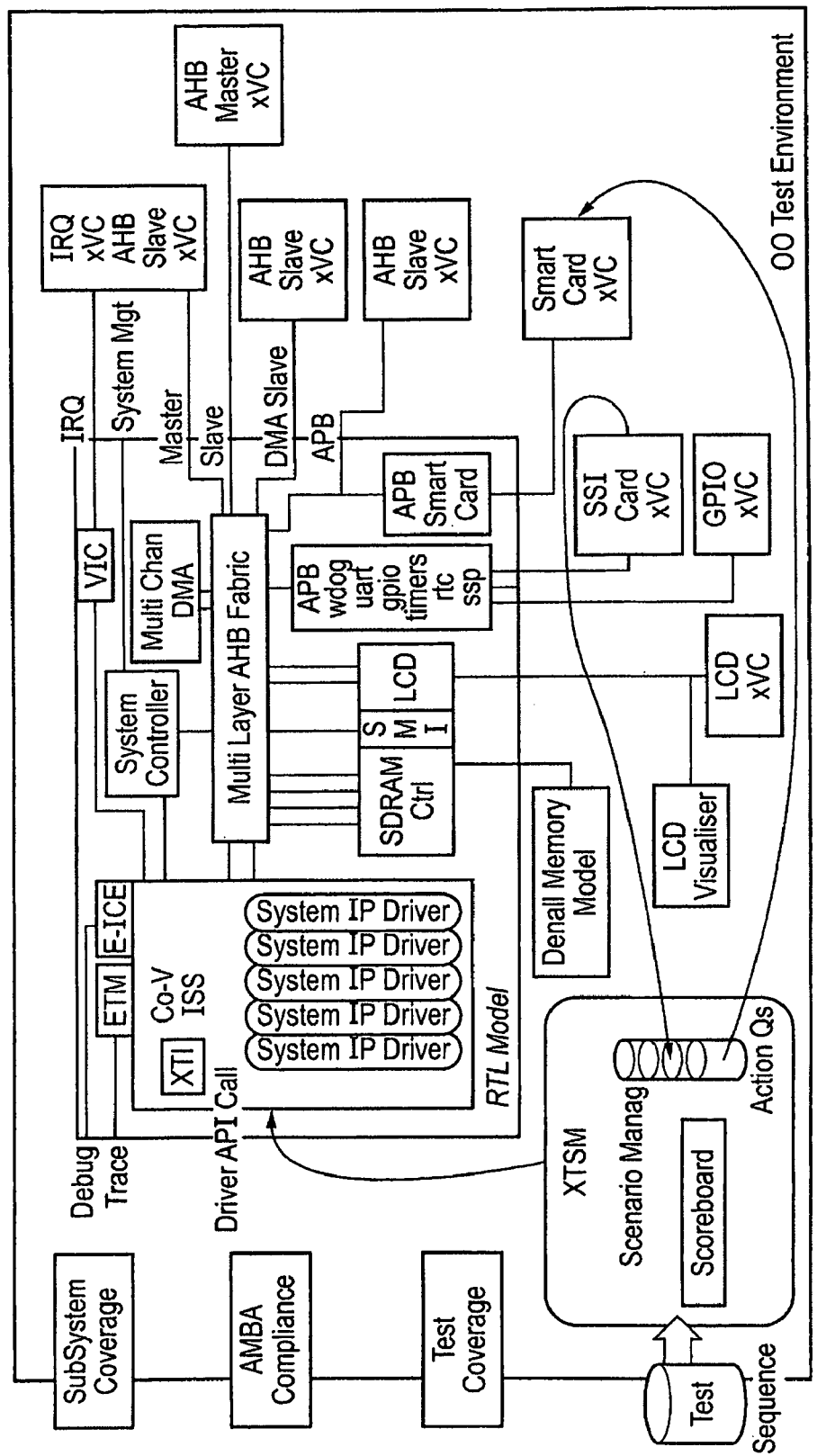

FIG. 4 illustrates another example testing environment. In this case the microprocessor core is provided in the form of an instruction set simulator. Such an instruction set simulator can be used to execute software programs that themselves require testing and validation. The XTSM can trigger the execution of those software programs which are then simulated by the instruction set simulator with the appropriate associated signals being passed on to other elements within the hardware simulation or captured from other elements within the hardware simulation. This effectively seeks to provide the ability to co-verify hardware and software designs.

It will be appreciated that the simulation environment discussed above may be provided entirely in the form of appropriate computer programs executing on a general purpose computer. The different portions of the simulation system, such as the XTSM, the XVCs, the hardware simulation etc may each be provided in the form of separate time consuming methods that concurrently execute upon the general purpose computer. The exchange of messages between such methods allows their coordinated interaction.

Figure 5:
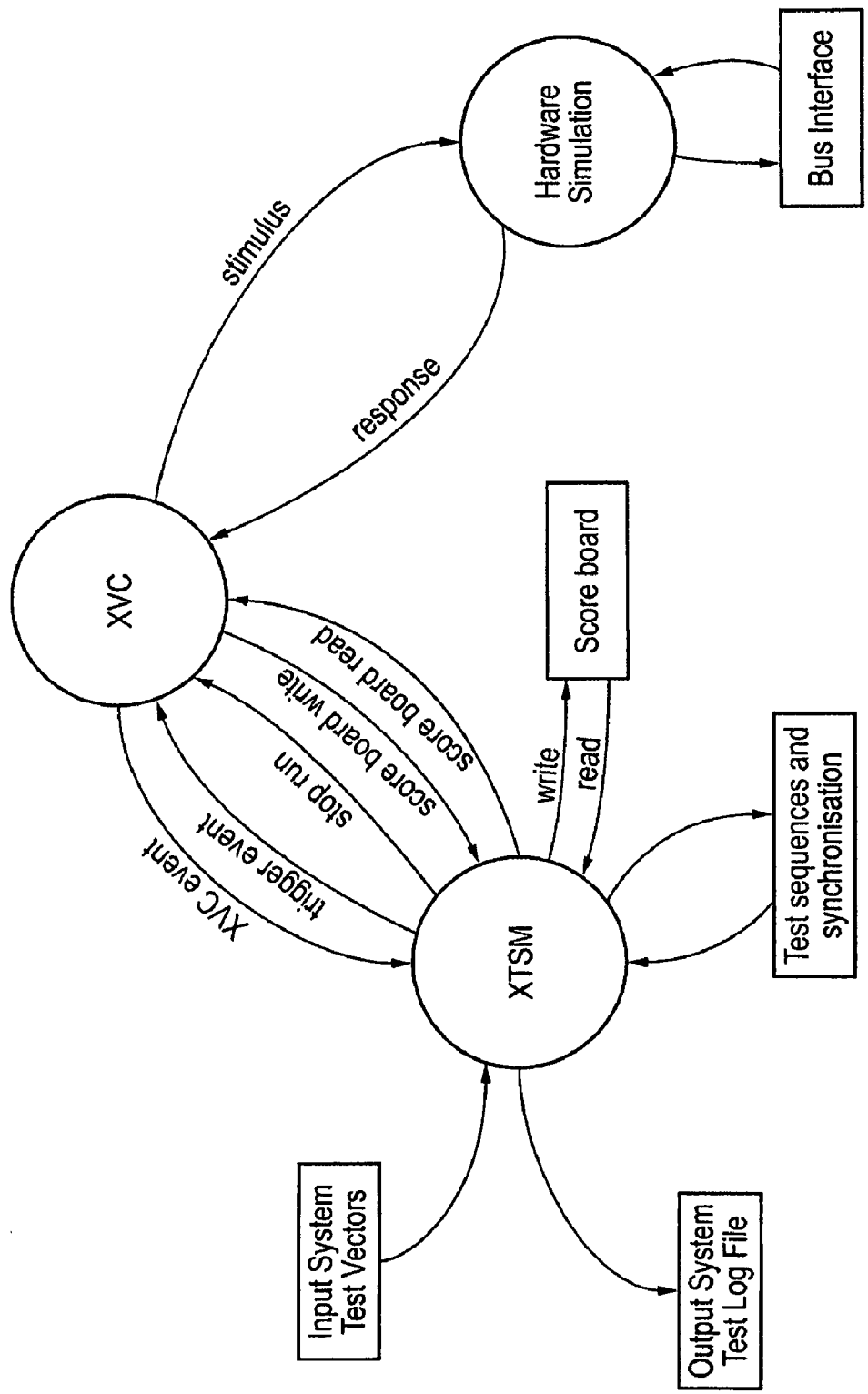
FIG. 5 schematically illustrates the exchange of data between different processes within the software running the simulation and validation of the present techniques.

FIG. 5 schematically illustrates the information flow between some of these separate processors. It will be seen that the XVC applies stimulus to and receives responses from the hardware simulation. The hardware simulation itself interacts with other elements within the hardware simulation via a bus interface. The XTSM exchanges test scenario controlling messages with the XVC including messages that trigger an event, stop an event and return a read value from the scoreboard (shared data memory). The XVC can generate its own test scenario controlling messages that are passed back to the XTSM and onto other XVCs indicating that a particular XVC event has occurred. The XVC may also request to write a value to the scoreboard or to read a value from the scoreboard. The score board provides an appropriate mechanism for XVCs sharing data and for the reporting of diagnostic information from an XVC to the XTSM. The XTSM reads it test sequences and synchronisation information from a further source and applies system test vectors and outputs a test log file as required in the particular circumstances.

Figure 6:
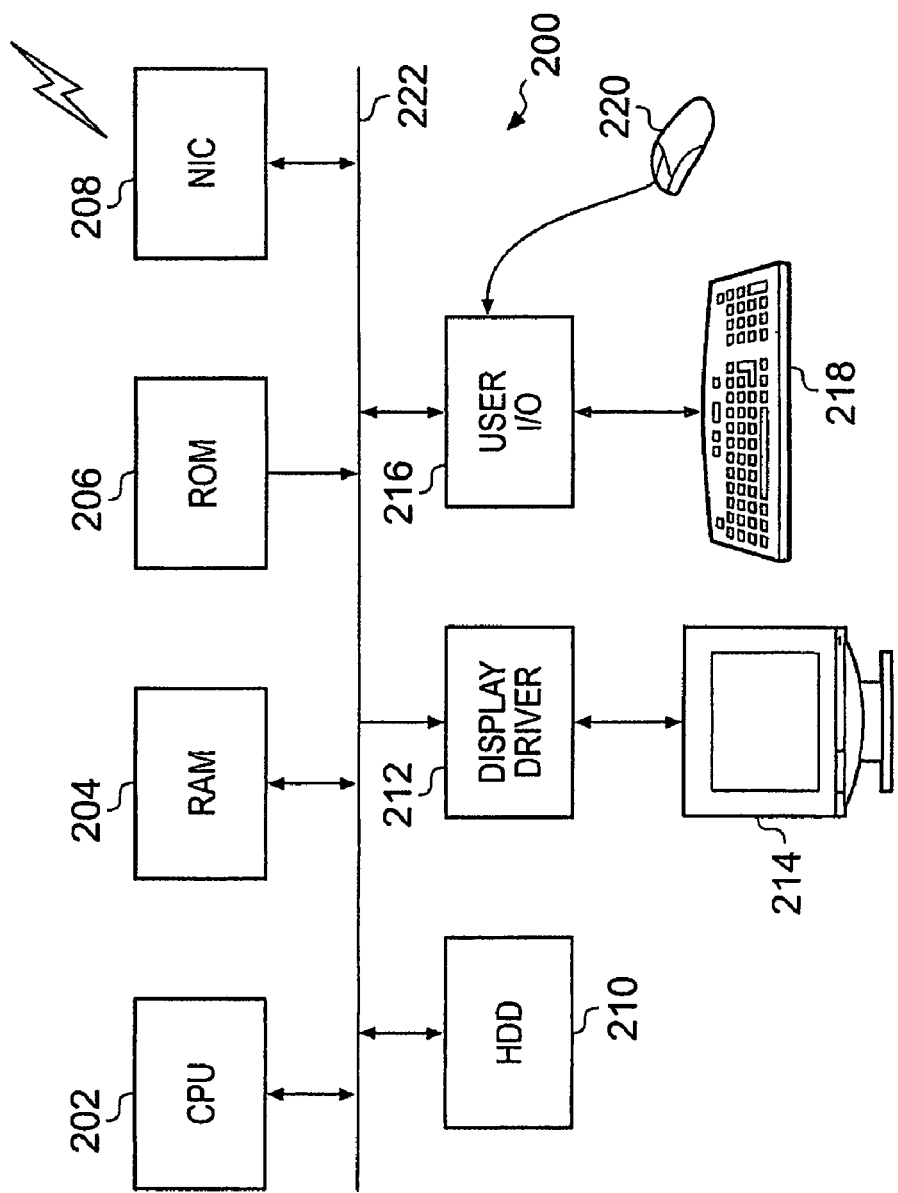
FIG. 6 schematically illustrates a general purpose computer of the type that may be used to implement the above techniques.

FIG. 6 schematically illustrates a general purpose computer 200 of the type that may be used to implement the above described techniques. The general purpose computer 200 includes a central processing unit 202, a random access memory 204, a read only memory 206, a network interface card 208, a hard disk drive 210, a display driver 212 and monitor 214 and a user input/output circuit 216 with a keyboard 218 and mouse 220 all connected via a common bus 222. In operation the central processing unit 202 will execute computer program instructions that may be stored in one or more of the random access memory 204, the read only memory 206 and the hard disk drive 210 or dynamically downloaded via the network interface card 208. The results of the processing performed may be displayed to a user via the display driver 212 and the monitor 214. User inputs for controlling the operation of the general purpose computer 200 may be received via the user input output circuit 216 from the keyboard 218 or the mouse 220. It will be appreciated that the computer program could be written in a variety of different computer languages. The computer program may be stored and distributed on a recording medium or dynamically downloaded to the general purpose computer 200. When operating under control of an appropriate computer program, the general purpose computer 200 can perform the above described techniques and can be considered to form an apparatus for performing the above described technique. The architecture of the general purpose computer 200 could vary considerably and FIG. 6 is only one example.

A further description of the simulation, validation and testing techniques described above is given in the following Appendix:

Contents

3  INTRODUCTION

3.1  Example Platform Overview

3.2  Test Strategy

3.3  Integration Verification Testing
  3.3.1    C Header files and macros
  3.3.2    Machine Readable Vectors
    3.3.2.1    FRBM stimulus format
    3.3.2.2    FRBM+ additional functionality
    3.3.2.3    FRBM stimulus command description
    3.3.2.4    Read-Modify-Write functionality
    3.3.2.5    Checking IRQ and DMA request lines
    3.3.2.6    PMAP Extensions
        3.3.2.6.1 Existing code
        3.3.2.6.2 Suggested Enhancements

3.4  System Level Verification
  3.4.1    C/C++ Libraries
    3.4.1.1    Bootstrap Module 3.4.1.2 Interrupt Handler
3.4.1.3 DMA Manager
3.4.1.4 System Function Manager
3.4.2 Example C++ modules
3.4.2.1 Directory Structure
3.4.2.1.1 asicvalidation
3.4.2.1.2 asicvalidation/latest-run
3.4.2.1.3 asicvalidation/data
3.4.2.1.4 asicvalidation/tests
3.4.2.1.5 asicvalidation/vcode
3.4.2.1.6 asicvalidation/vcode/pmap
3.4.2.1.7 asicvalidation/vcode/init
3.4.2.1.8 asicvalidation/vcode/classes
3.4.2.1.9 asicvalidation/vcode/classes/easy
3.4.2.1.10 asicvalidation/vcode/classes/primecell
3.4.2.1.11 asicvalidation/vcode/classes/validation
3.4.2.1.12 asicvalidation/vcode/classes/asic
3.4.2.1.13 Putting it all together
3.4.3 Software driver test co-ordinator
3.4.3.1 Methodology
3.4.3.1.1 Directory Structure
3.4.3.1.2 IPval/integration
3.4.3.1.3 IPval/integration/VHDL/...
3.4.3.1.4 IPval/integration/verilog/...
3.4.3.1.5 IPval/integration/xvcs/RTL/...
3.4.3.1.6 IPval/integration/xvcs/specman
3.4.3.1.7 IPval/integration/system
3.4.3.1.8 IPval/integration/system/xtsm
3.4.3.1.9 Principles of FSPM test software operation
3.4.3.1.10 Software test co-ordinator usage model (RTL)
3.4.3.1.11 Software test co-ordinator usage model (RTL and Specman)
3.4.3.2 Software test co-ordinator directory structure
3.4.3.2.1 IPval/vcode/vcode
3.4.3.2.2 IPval/vcode/init
3.4.3.2.3 IPval/vcode/pmap
3.4.3.2.4 IPval/vcode/classes/asic
3.4.3.2.5 IPval/vcode/classes/primecell
3.4.3.2.6 IPval/vcode/classes/system
3.4.3.2.7 IPval/vcode/classes/validation
3.4.3.2.8 Software verification structure: Object interconnectivity
3.4.3.2.9 Software verification structure: Main software driver test co-ordinator object
3.4.3.2.10 Software verification structure: The next step, Scenarios and Actions
3.4.4 External verification components
3.4.4.1 Verilog RTL XVC reference model example
3.4.4.2 Specman XVC reference model overview
3.4.4.3 Specman XVC reference model overview : Peripheral Facing Interface (PFI)
3.4.4.4 Specman XVC reference model overview : Action Generator Interface (AGI)

3.4.4.5 Annotation notes : Message error levels
3.4.4.6 Specman XVC reference model overview : External Test Scenario Manager Interface (XTI) 48
3.4.4.7 Specman XVC reference model overview: Operating Modes
3.4.4.8 Example Top level Specman code for a CLCD XVC

3.5 System Level Validation
3.5.1 XVC Test scenario Manager (XTSM) overview
3.5.2 Handling Timeouts
3.5.3 Stop Run Mechanism
   3.5.3.1 Example Top level Specman code for an XTSM
3.5.4 AHB Master XVC/XTSM interaction overview
   3.5.4.1 AHB Master XVC stimulus format
   3.5.4.2 XTSM stimulus format
   3.5.4.3 AHB Master XVC stimulus command description (as FRBM)
   3.5.4.4 XTSM stimulus command description 3.5.4.4.1 AHB Master XVC and XTSM stimulus command parameters used 3.5.4.4.2 The E,O and T commands 3.5.4.4.3 The D,A and X commands 3.5.4.4.4 The @ and F commands 3.5.4.4.5 Interrupt and DMA request latency 3.5.4.4.6 Command Timeouts 3.5.4.4.7 AHB Master XVC Block diagram 3.5.4.5 Example Top level Specman code for an AHB Master XVC
3.5.5 General extension of XVCs by users
3.5.6 System Scenario Specification
3.5.7 Top Level Environment
   3.5.7.1 Example Top level Specman code for a FSP_env
   3.5.7.2 Example system validation environment user configuration file
3.5.8 System Level Coverage & Scoreboarding
3.5.9 Linking in existing RTL Models

3.6 3rd Party Test Environment Integration

3.7 Verification & Validation environment Deliverable Composition
3.7.1 Integration Testing
3.7.2 System Verification
3.7.3 System Validation

Introduction
Example Platform Overview

The ARM wireless platform solution (WPS) is targeted at enabling a high degree of re-use in generating a family of mobile products. A family will typically have different performance levels to enable a variety of applications from simple address book to full video phone, from simple web browsers to executing downloaded Java applications.

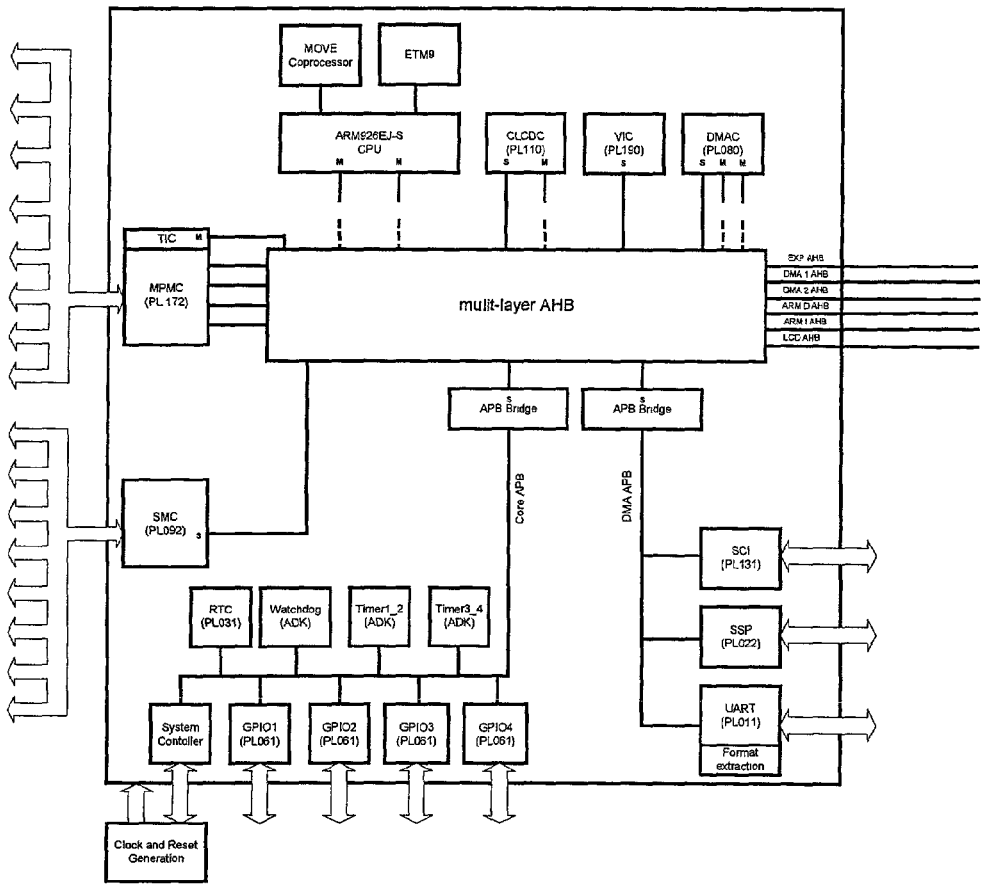

*Figure 1: Functional Block Diagram of the first WPS*

The wireless platform solution is based on a multi-layer AHB bus structure together with a pre-defined interconnection of a number of PrimeCell peripherals, which can be driven by a 926 ARM core suitable for the final application and operating system the end device will run. Central to the philosophy of the subsystem is that it only contains common, but required IP needed for a particular family of OS ports. AHB and APB expansion capabilities are provided to allow OEM driven Silicon Partner differentiation by the addition of high value application specific IP and modification.

As platforms such as the WPS shown above are becoming increasingly more complex, the verification effort required ensuring that a defect free product gets rolled into fabrication increases dramatically. It is the intent of this methodology document to introduce new verification strategies to meet this challenge.

Test Strategy

The prime aim of the platform verification code in this system is that of re-configuration and re-use, in order that the base system can be configured to build any one of a family of products. Test modules will be divided into two main categories; those that support individual devices that interface to the system, and those that generate system-level 'scenarios' in which a subset of general application specific behaviour is modeled.

To summarize, two levels of verification are to be supported:

- Integration Verification

- Directed System Level Verification

It is envisaged that these two strategies have two discrete top-level testbenches, but essentially work on the same RTL platform components. The advantage that the Integration Verification had over the System Level Verification is that it is a very light and configurable environment with no EDA tool license dependencies other than the simulator license.

Integration Verification Testing

As identified in the terms and abbreviations section above, level 1 and 2 tests are supported in a semiautomatic manner for this platform. A configuration stage is prepared using in-house scripting tools (PMAP) to identify the system address map configuration. Register descriptions are also provided which identify devices that connect to the system address map.

This configuration information is then converted to:

- C Header files and macros that can be cross-compiled to facilitate hardware access using an ARM core

- A machine-readable vector format such that automated integration testing can be performed C Header files and macros When an ARM core is instantiated in the platform, these pre-generated files can be compiled using appropriate target core compilation and linking flag(s). When executed, bus vectors are generated from the core that accesses the desired memory mapped registers. These modules can then be manually extended to form basic drivers for each of the peripherals that are present. For integration testing however, driver level access is not required.

IRQ and DMA request line connectivity can be verified through firstly programming the test registers of each PrimeCell device, and then examining the status registers of the interrupt controller and DMA controllers respectively.

Machine Readable Vectors

The machine-readable vector format is intended for use with a file reader bus master (FRBM) or similar device, which is part of the AMBA design kit (ADK). A basic level of integration testing can be achieved in this way by reading register Ids. The format for such vectors is given below. Note here that the ADK FRBM has been modified at the time of writing to include additional functionality shown in bold type. The 'FRBM+' is currently under the Onyx IS003 project

1.1.1.1 FRBM stimulus format

```
W Address Data [Size] [Burst] [Prot] [Select]
R Address Data [Mask] [Size] [Burst] [Prot] [Select]
S Data [Mask]
B
I [Address] [Dir] [Size] [Burst] [Prot] [Select]
P Address Data [Mask] [Size] [INCR|SINGLE] [Prot] [Select]
L Number
M Num_cycles [Addr_Low Addr_High]
C "Simulation Comment"
```

1.1.1.2 FRBM+ additional functionality

The following enhancements will be made to the existing FRBM:

- Add an [ERROR] field into the R and W commands such that errors can be 'expected' responses
- Add a [Timeout] field to the P command to poll for 'timeout' tries before reporting an error
- EOF of the stimulus file generates an error count report
- Add a Q command to force an EOF and a simulation halt
- A stimulus file input line number output on errors in R,W and P commands

1.1.1.3 FRBM stimulus command description

*W* The write command starts a write burst and may be followed by a number of S vectors
*R* The read command starts a read burst and may be followed by a number of S vectors
*S* The Sequential vector provides data for the remaining beats in a burst. The testbench is responsible for calculating the address required
*B* The Busy vector inserts a Busy transfer in the middle of a burst
*I* The Idle command performs an Idle transfer
*P* The Poll command performs a read transfer which repeats until the data matches the required value. The Poll vector can only be used for INCR or SINGLE burst types
*L* The Loop command repeats the last command a number of times. In AHB, if a loop command follows a W or R command then it is only legal for the burst type to be INCR or SINGLE
*M* The Memory test command causes the testbench to generate random transfers in the address range (from Addr_Low to Addr_High). The testbench should only generate read transfers from addresses that it has previously written to, so that expected read data is always known
*C* The Comment command prints out a message to the simulation window

1.1.1.4 Read-Modify-Write functionality

To overcome the destructive nature of the FRBM test writes; in that unlike a core, the FRBM does not have holding registers, the following sequence will be used for register testing:

- Read default register value
- Write new register value
- Read back new register value
- Restore default register value
- Next register test...

1.1.1.5 Checking IRQ and DMA request lines

It is relatively easy to install an interrupt handler using core-based verification code, similarly for checking that DMA requests has reached their destination. However, although essentially the same procedure is used as in 3.3.1, defining how an automated vector file can be used to check these connections is more complex.

One solution would be to enhance the PMAP utility to provide in the template a vector reference file used to generate an interrupt on the target device. Placeholders in the vector file would be used to fill in address map entries corresponding to registers specified by the template.

1.1.1.6 PMAP Extensions

1.1.1.6.1 Existing code

The sources directory for this tool currently exist within the following synchronicity vault :

```
sync://cam-sync-
soc.cambridge.arm.com:3000/Projects/scb17/SocValidationTools/AsicValidation/bin
```

The following code modules associated with PMAP are:

```
PMap2Code

PMap2Headers make_peripherals
```

The make_peripherals script is used to call the PMap conversion routines, this script takes a command line parameter specifying a peripherals_list file. It is the peripherals_list file that determines the memory map of the system. An example peripherals_list file would be:

```
Tube          uTube         0x20000000
IntCntl       uIntCntl      0x80000000
Timers        uFRC1         0x82000000
Timers        uFRC2         0x84000000
RemPause      uRemPause     0x88000000
```

Note that the first column specifies a template file, the second column specifies an instance name that will be used in generating the header files and code, and the final column specifies the base address in the system memory map where the peripheral is installed (decoder configuration).

Each template file defines the registers required to access the peripheral. The Timers file (Timers.pmap) from the above example is as follows:

```
Peripheral    Timers

Register      Load
Offset        0
Mask          0xffff

Register      Value
Mask          0xffff

Register      Control
Bitfield      Enable Periodic - - Prescale8 Prescale4 - -

Register      Clear

Register      Test
```

1.1.1.6.2 Suggested Enhancements

One additional modules will be created to support PMAP are:

PMap2Vectors

This module will generate a sequence of test vectors in FRBM format as described in section 3.3.2.1 above. The vectors will support initial value, RW and RO tests, providing the same functionality as provided by the Pmap2Code module.

The make_peripherals script is modified to include IRQ and DMA test register values corresponding to the DMA and IRQ values that need to be checked. An example extended peripherals_list file would be:

```
Tube            uTube           0x20000000
IntCntl         uIntCntl        0x80000000
Timers          uFRC1           0x82000000 I 0x00000001
Timers          uFRC2           0x84000000 I 0x00000002
RemPause        uRemPause       0x88000000
GPIO            uGPIO           0x8C000000 I 0x00000004 I 0x00000008 F 0x00000002 D
0x00000001
```

Note that the first three columns are as specified in 3.3.2.4.1 above. However additional IRQ/FIQ/DMA status register values have been included. These are translated into reference parameter values for later use:

```
uFRC1.IVAL1 = 0x00000001        uFRC1.IVALMASK1 = 0xFFFFFFFE
uFRC2.IVAL1 = 0x00000002        uFRC2.IVALMASK1 = 0xFFFFFFFD
uGPIO.IVAL1 = 0x00000004        uGPIO.IVALMASK1 = 0xFFFFFFFB
uGPIO.IVAL2 = 0x00000008        uGPIO.IVALMASK2 = 0xFFFFFFF7
uGPIO.FVAL1 = 0x00000002        uGPIO.FVALMASK1 = 0xFFFFFFFD
uGPIO.DVAL1 = 0x00000001        uGPIO.DVALMASK1 = 0xFFFFFFFE
```

Each template will also have a new command to specify a vector file associated with it that will be incorporated into the vector output file generated for the peripheral, *note that these options must be ignored by PMap2Headers or PMap2Code*. The name of the test vector sequence will appear as comment lines in the vector output file. An enhanced Timers.pmap file is given below:

```
Peripheral      Timers

Register        Load
Offset          0
Mask            0xffff

Register        Value
Mask            0xffff

Register        Control
Bitfield        Enable Periodic - - Prescale8 Prescale4 - -

Register        Clear

Register        Test

Vectors         "Generate Interrupt"
File            ~/work/proj/TimerIRQ.vec
```

Any number of Vectors entries may be included in a template. The vector file itself has address placeholders that reference any of the peripherals-list entries register names such that interaction with other devices may also be specified. A sample TimerIRQ.vec file is given below:

```
// Vector file to generate a Timer IRQ and check the interrupt controller that the IRQ
has registered
C "Timer Interrupt test"
W .Control 0x0                             ; Disable Timer
W .Clear   0x0                             ; Clear Interrupts
W .Load    0xFFFF                          ; Load Count
W .Control 0x80                            ; Enable Timer
P .Value   0x0                             ; Poll value register until count = 0
R uIntCtl.IRQStatus .IVAL1 .IVALMASK1      ; Read Interrupt controller register for
correct IRQ flag
C "Timer Interrupt test pass"  ; Will fail on above command if test fails
```

In the example above, the vector template describes the AHB vectors required to check that a timer IRQ line is wired correctly to the interrupt controller. As no size or burst information is used in these vectors, the defaults of WORD and INCR are used by the FRBM. Note also the fields requiring substitution; a leading '.' implies that the current instance should be used i.e. the current instance being processed from the peripherals_list input file. A preceeding instance name refers to an existing peripheral that has already been defined.

After processing, this vector file template will appear in the output vector file for uFRC1 as:

```
C "uFRC1 begin: Generate Interrupt"
// Vector file to generate a Timer IRQ and check the interrupt controller that the IRQ
has registered
C "uFRC1: Timer Interrupt test"
W 0x82000008 0x00000000                          ; Disable Timer
W 0x8200000C 0x00000000                          ; Clear Interrupts
W 0x82000020 0x0000FFFF                          ; Load Count
W 0x82000008 0x00000080                          ; Enable Timer
P 0x82000024 0x00000000                          ; Poll value register until count = 0
R 0x80000000 0x00000001 0xFFFFFFFE  ; Read Interrupt controller register for correct
IRQ flag
C "uFRC1: Timer Interrupt test pass"  ; Will fail on above command if test fails
C "uFRC1 end: Generate Interrupt"
```

All 'Vectors' statements will be appended at the end of the .vec output files. Note that "<instance> begin: <Label>", "<instance> end: <label>" and "<instance:>"are added to the vector file comments. It is recommended that the implementation of the vector file templates be done at a post-processing phase of peripherals_list i.e. generate all .h, .c, .vec files first for each entry, and then scan each template in again searching for the 'Vectors' statement for appending to the end of the existing file e.g. Timers.vec in the example above.

Where a delay is required before checking an interrupt status register, then it is recommended that a loop (L) command be inserted between the P and R statements. Note that it is implied that the test will fail if R reads back a different value to that specified.

Finally, although explicit example for FIQ and DMA request line testing have not been provided here, the logic and implementation is the same as that for IRQ testing.

System Level Verification

Building on the integration test code auto generated C header files and macros mentioned in 3.3.1, the following system level test components would need to be generated:

- A software driver test co-ordinator

- C/C++ code libraries that can be cross-compiled to facilitate hardware access using an ARM core

- Specman e language models for connection to external peripheral interfaces (3.4.2)

- A BFM/External model test scenario manager that schedules the invocation of pre-defined external system events (future implementations will use a core instead of a BFM)

Software driver verification (observing the correct configuration and execution of ARM Software Systems PrimeCell driver objects at API level), will primarily be implemented as a set of directed tests running on a core DDM model. These tests will be linked via a common control routine that takes advantage of shared interrupt/DMA and system function drivers developed specifically to support the software test environment. In addition, the external models will be configured to support simple transactions to prove driver functionality.

Note that a DSM is also required to test the MOVE co-processor shown in figure 1, as the DDM does not currently support co-processor models. The DDM will only be used for the software-testing phase as there is no existing Specman link available between the DDM or between the DSM.

It is important to note here that the test scenario manager will be implemented in Specman, and will interface to a Specman bus functional model to invoke responses from the external Specman e language models. This BFM/External model test scenario manager will <u>not</u> be responsible for software driver testing.

C/C++ Libraries

Due to the nature and complexity of such a configurable platform, it is recommended that a set of support modules be developed as C++ objects. These modules can then be re-used, and re-configured easily to encapsulate the functionality of the specific devices/services that they support.

1.1.1.7 Bootstrap Module

This module is required to initialise the vector table, set-up exception mode stacks, and any low-level device initialisation before the C library itself is initialised – suggested platform bootstrap tasks include:

| Action |
|---|
| Setup Vectors |
| Initialise SMC and active banks |
| Initialise SDRAM controller and active banks |
| Perform optional address remap function |
| Initialises CPU – ROM cache and load table |
| Set up stacks and heap and then... |
| switch to USER mode with IRQ and FIQ enabled |
| Call __main() defined within __rtstand.s |

1.1.1.8 Interrupt Handler

This module is to provide a software interface for programming the VIC (PL190), and to provide default error handlers for peripheral interrupts e.g. Timers, Watchdog, System controller etc. Each of the corresponding manager modules listed below can then install their own interrupt handling routines. The following table shows a suggested level of functionality provided from this API:

| API Method | Comments |
|---|---|
| int vic_Initialise(void); | Initialise and disable interrupts |
| unsigned int vic_CauseSoftInterrupt(void); | Cause Software controlled IRQ |
| unsigned int vic_ClearSoftInterrupt(void); | Clear above IRQ |
| Void vic_EnableTestMode(unsigned int is_irq); | Switch into test Mode |
| Void vic_DisableTestMode(unsigned int is_irq); | Switch out of test Mode |
| unsigned int vic_CauseTestInterrupt(unsigned int iTest, unsigned int is_irq); | Cause any IRQ in test mode |
| unsigned int vic_ClearTestInterrupt(unsigned int iTest, unsigned int is_irq); | Clear test mode IRQ |
| interrupthandler vic_InstallHandler(unsigned int interrupt_ids, interrupthandler handler, unsigned int is_irq); | Install handler, note IRQs can be or'ed (\|) together to use the same handler |
| void vic_EnableInterrupt(unsigned int interrupt_ids, unsigned int is_irq); | Enable IRQ(s) e.g. IRQ1\|IRQ2\|IRQ4 |
| void vic_DisableInterrupt(unsigned int interrupt_ids); | Disable above |
| Unsigned int vic_IsInterruptEnabled(unsigned int interrupt_id, unsigned int is_irq); | Check if an IRQ is enabled |

1.1.1.9 DMA Manager

The DMA manager module will provide an API for configuring the DMA controller (PL080), for example setting up the channels with source and destination addresses, master port selection, error and termination interrupt generation, flow control etc. The DMA manager also acts as the DMA interrupt handler. The following table shows a suggested level of functionality provided from this API:

| API Method | Comments |
|---|---|
| void dmac_Initialise(void); | Initialise and disable interrupts |
| void dmac_Enable(void); | Enable DMAC |
| void dmac_Disable(void); | Disable DMAC |
| void dmac_EnableTestMode(void); | Switch into test Mode |
| void dmac_DisableTestMode(void); | Switch out of test Mode |
| void dmac_ClearInterrupt(void); | Clear DMAC IRQ |
| void dmac_SetUpSingleM2MXfer(unsigned src, unsigned dest, unsigned width); | Set up a single mem. to mem. transfer |
| unsigned dmac_StartSingleM2MXfer(dmacallback callback); | Start a single mem. to mem. transfer |
| unsigned dmac_SetupMultiM2MXfer(unsigned src, unsigned dest, unsigned num, unsigned width); | Set up a multiple mem. to mem. Transfer |
| unsigned dmac_StartMultiM2MXfer(dmacallback callback); | Start a multiple mem. to mem. transfer |
| void dmac_SetUpSingleM2PXfer(unsigned idPeriph, unsigned chan, unsigned src, unsigned dest, unsigned width); | Set up a single mem. to periph. transfer |
| unsigned dmac_StartSingleM2Pxfer(dmacallback callback); | Start a single mem. to periph. transfer |
| unsigned dmac_SetupMultiM2PXfer(unsigned idPeriph, unsigned chan, unsigned src, unsigned dest, unsigned num, unsigned width); | Set up a multiple mem. to periph. Transfer |
| unsigned dmac_StartMultiM2PXfer(dmacallback callback); | Start a multiple mem. to periph. transfer |

Further combinations will also be required e.g. P2M, P2P etc

1.1.1.10 System Function Manager

This module will be responsible for configuring all of the Watchdog, Timers, RTC (PL030) and System Controller. The following table shows a suggested level of functionality provided from this API:

| API Method | Comments |
|---|---|
| `void sys_Initialise(void);` | Initialise system devices and disable interrupts |
| `unsigned sys_timerAllocate(unsigned id);` | Allocate a timer for use |
| `void sys_timerRelease(unsigned_id);` | Release a timer |
| `void sys_timerSetSingleInterruptMode(unsigned id, unsigned bEnable);` | Enable/Disable a Timer |
| `unsigned sys_timerConfigure(unsigned id, unsigned uLoadValue, unsigned uPrescale, unsigned uTimerMode, timercallback callback);` | Configure a Timer |
| `unsigned sys_timerStart(unsigned id, long uLoadValue);` | Start a timer with optional load value (-1) for default value |
| `Unsigned sys_timerStop(unsigned id);` | Switch out of test Mode |
| `void sys_watchdogEnable(void);` | Enable watchdog timer |
| `void sys_watchdogDisable(void);` | Disable watchdog timer |
| `void sys_watchdogConfigure(unsigned uLoadValue, unsigned uPrescale, wdcallback callback);` | Set up a single mem. to mem. transfer |
| `unsigned sys_GetSysStatus(void);` | Return sys. controller status |
| `unsigned sys_SetSysStatus(unsigned uSysStatus);` | Set sys. Controller status |
| `unsigned sys_GetResetStatus(void);` | Return reset status |
| `unsigned sys_GetPLLStatus(void);` | Get PLL status |
| `unsigned sys_SetPLLStatus(unsigned uPLLStatus);` | Set PLL state |
| `unsigned sys_GetXTALStatus(void);` | Get Clock Crystal status |
| `unsigned sys_SetXTALStatus(unsigned uPLLStatus);` | Set Clock Crystal state |
| `unsigned sys_GetCTRLStatus(unsigned addr);` | General purpose control register read |
| `unsigned sys_SetCTRLStatus(unsigned addr, unsigned uStatus);` | General purpose control register write |

Example C++ modules

The various API methods in section 3.4.1 above are shown as C style functions prototypes. However, it is intended that C++ classes encapsulate these prototypes, such that system components are viewed as objects with the API functionality encapsulated within them.

Some research was conducted into the feasibility of encapsulating objects in this way, and an example system was built and tested using these concepts. This section provides sample code from this project as a proof of concept that embedded C++ can be effective for verification.

1.1.1.11 Directory Structure

The synchronicity vault containing these sources is located in:

```
sync://cam-sync-
soc.cambridge.arm.com:3000/Projects/scb17/cpp_libraries/EASY_Micropack_2_0/ADS_cpp
```

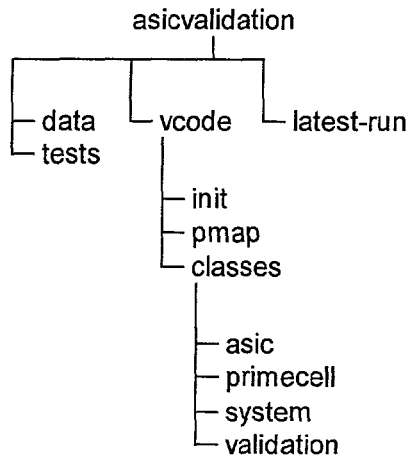

*Figure 2: C++ software directory structure*

The in-house software build configuration tools used here were AsicValidation and PMAP; note their positions in the directory hierarchy. This structure is commonly used through-out current C based IPSD consultancy projects.

1.1.1.11.1 asicvalidation

Top level directory containing the AsicValidation configuration files:

```
AsicValidationFiles        ; Config file containing source and
dest dirs
AsicValidationParams       ; Perl Script for custom
AsicValidation functionality
modelsim.ini               ; Simulator template ini file
run.do                     ; Simulator startup script
SourceMe                   ; Shell script for environment setup
```

1.1.1.11.2 asicvalidation/latest-run

Run directory for simulation, code images and test data get copied here also.

1.1.1.11.3 asicvalidation/data

Test input data image files directory

1.1.1.11.4 asicvalidation/tests

List of top level tests available. These files are empty, and act as reference testbench parameters that can be passed to AsicValidation:

```
HelloWorld              ; Refers to HelloWorld.cpp below
EASYTestAll             ; Refers to EASYTestAll.cpp below
```

1.1.1.11.5 asicvalidation/vcode

Top level test code directory:

```
Makefile                ; Top level makefile (refers to
StdMakefile)
README
HelloWorld.cpp          ; Example top level test module 1
memory_map.scatter      ; System code address map
memory_map.inc          ; Address map defines (ASM)
memory_map.h            ; Address map defines (C/C++)
EASYTestAll.cpp         ; Example top level test module 2
```

1.1.1.11.6 asicvalidation/vcode/pmap

Contains register interface definitions for each peripheral in the system. The makeperipherals PMAP tool is used to build both C headers and basic register test code. Note that each header is compatible also with C++:

```
Makefile                ; Builds lib_pmap.a
README
IntCntl.pmap
RemPause.pmap
Timers.pmap
Tube.pmap
peripherals_list
```

1.1.1.11.7 asicvalidation/vcode/init

Contains boot code as described in section 3.4.1.1:

```
Makefile                ; Builds lib_init.a (refers to
StdMakefile)
init.s
InitLib.c
ExtMemInit.s
InitStackHeap.s
SWIHandler.s
SetupCPU.s
StartCode.s
```

DoRemap.s

1.1.1.11.8 asicvalidation/vcode/classes

Conventionally a C based AsicValidation environment will contain a lib directory. In this C++ example a classes directory is used instead. The StdMakefile in this directory contains predicates for assembling, compiling and linking code, along with the command line parameters for each tool:

```
StdMakefile              ; Referenced by all Makefiles
```

1.1.1.11.9 asicvalidation/vcode/classes/easy

The easy class contains any system-specific support components. This example is based on the AMBA EASY world:

```
Makefile                 ; Builds classlib_easy.a (refers to
StdMakefile)
CException.hpp
CException.cpp           ; Exception handler
CIRQFIQ.hpp
CIRQFIQ.cpp              ; IRQ/FIQ Manager
CCT.hpp
CCT.cpp                  ; Timers Manager
CTUBE.hpp
CTUBE.cpp                ; Debug port manager
```

The exception class definition appears as follows:

```
//---------------------------------------------------------------
-----
// CException . Exception Handler Class Definition
//
class CException : public SoCObject
{
  // Allow access to private members from the following functions/classes
  friend void EHAND_UndefinedInstruction(void);
  friend void EHAND_SoftwareInterrupt(unsigned int number, unsigned int *reg);
  friend void EHAND_PrefetchAbort(void);
  friend void EHAND_DataAbort(void);

public:
   // Constructor/Destructor
   CException();
   ~CException();
};
```

The IRQ/FIQ Manager class definition appears as follows:

```
//--------------------------------------------------------------------
// IRQFIQ . Interrupt Controller Class Definition
//
class CIRQFIQ : public SoCObject
{
  // Allow access to private members from the following functions/classes
  friend __irq void IRQFIQ_IRQDispatcher(void);
  friend __irq void IRQFIQ_FIQDispatcher(void);

public:
    // Constructor/Destructor
    CIRQFIQ();
    ~CIRQFIQ();

// Force a software controlled interrupt to occur
    virtual unsigned int CauseSoftInterrupt(void);

// Clear the software controlled interrupt
    virtual unsigned int ClearSoftInterrupt(void);

// Switch into test mode
    virtual void EnableTestMode(unsigned int is_irq);

// Switch out of test mode
    virtual void DisableTestMode(unsigned int is_irq);

// Force a test interrupt to occur
    virtual unsigned int CauseTestInterrupt(unsigned int iTest, unsigned int is_irq);

// Clear the test interrupt
    virtual unsigned int ClearTestInterrupt(unsigned int iTest, unsigned int is_irq);

// Installs a handler for the specified interrupt number.
    // Multiple sources can be combined by '|' them together, the handler
    // is installed for all of them.
    PSOCOBJECT InstallHandler(unsigned int interrupt_ids, PSOCOBJECT handler, unsigned int is_irq);

// Allows interrupts of the type specified to occur on the interrupt
    // source specified. (multiple sources can be combined by '|' them together)
    virtual void EnableInterrupt(unsigned int interrupt_ids, unsigned int is_irq);

// Stops interrupts of the type specified occuring on the interrupt
    // source specified. (multiple sources can be combined by '|' them together)
    virtual void DisableInterrupt(unsigned int interrupt_ids);

// Checks to see if an interrupt is enabled
    virtual unsigned int IsInterruptEnabled(unsigned int interrupt_id, unsigned int is_irq);

protected:
    // Initialises the Interrupt handler, disables ALL interrupts
    int Initialise(void);

private:
    // Interrupt Vector Table
    PSOCOBJECT m_IRQHandler[IntCntlNUM_IRQS];
    PSOCOBJECT m_FIQHandler[IntCntlNUM_FIQS];

// Handlers activated
    unsigned int m_IRQHandlerInstalled;
    unsigned int m_FIQHandlerInstalled;

// Install IRQ Handler
    PSOCOBJECT Install_IRQ_handler(unsigned irqnum, PSOCOBJECT handler);

// Install FIQ Handler
    PSOCOBJECT Install_FIQ_handler(unsigned irqnum, PSOCOBJECT handler);

// IRQ/FIQ Dispatchers
    // Dispatch interrupts to the relevant handler
    // ONLY Handles interrupts with handlers defined
    void IRQDispatcher(void);
    void FIQDispatcher(void);
};
```

The Timer Manager class definition appears as follows:

```
//-------------------------------------------------------------------
// CCT . Counter Timer Class Definition
//
class CCT : public SoCObject
{
  public:
    // Constructor/Destructor
    CCT(unsigned int uBaseAddress, unsigned int IID, unsigned int bIsIRQ, CIRQFIQ* pIRQFIQ);
    CCT();
    ~CCT();

// Intialise Class Data
    void InitClass(unsigned int uBaseAddress, unsigned int IID, unsigned int bIsIRQ, CIRQFIQ*
pIRQFIQ);

// Get access to a timer
    virtual unsigned int AllocateTimer(PSOCOBJECT defaulthandler = (PSOCOBJECT)NULL);

// Release a timer for re-use
    virtual unsigned int ReleaseTimer(void);

// Set and interrupt handler function for a given timer
    virtual unsigned int SetTimerHandler(PSOCOBJECT handler, PSOCOBJECT& oldhandler);

// Set interrupt disable mode
    virtual void SetSingleInterruptMode(unsigned int bEnable = FALSE);

// Setup Timer Configuration
    virtual unsigned int ConfigureTimer(unsigned int uLoadValue = CT_MAXVALUE, unsigned int
uPrescale = CT_PRE0, unsigned int uTimerMode = CT_FREERUNNING);

// Start a timer (with given load value, -1 does not set a load value)
    virtual unsigned int StartTimer(long uLoadValue = -1L);

// Stop a timer
    virtual unsigned int StopTimer(void);

// Get IRQ/FIQ Status of a timer
    unsigned int GetInterruptCount(void) {return m_nInterruptCount;}
    unsigned int GetLastInterruptID(void) {return m_nLastInterruptID;} protected:
    // IRQ Callback routine
    virtual void IRQ_Callback(unsigned int uIRQ);

// FIQ Callback routine
    virtual void FIQ_Callback(unsigned int uFIQ);

private:
    // Timer allocation status
    unsigned int m_bAllocated;
    volatile struct s_Timers *m_pDevice;

PSOCOBJECT m_OldHandler;
    unsigned int m_nInterruptCount;
    unsigned int m_nLastInterruptID;
    unsigned int m_bSingleInterruptMode;
    unsigned int m_IID;
    unsigned int m_bIsIRQ;

// Define access to interrupt controller
    CIRQFIQ* m_pIRQFIQ;
};
```

The TUBE Manager class definition appears as follows. Note also the inclusion of a C wrapper illustrating access from C++ to low-level C/assember driver routines:

```
//---------------------------------------------------------------------
// Define C Interface Wrappers Here
// ifdef __cplusplus
extern "C" {
endif void TUBE_PutChar(char ch);
void TUBE_Message(const char *szMsg);
void TUBE_ErrMessage(const char *szErrMsg);
void TUBE_Exit(void);

#ifdef __cplusplus
}
#endif

//---------------------------------------------------------------------
// CTUBE . CTUBE Class Definition
//
class CTUBE : public SoCObject
{
  public:
    // Constructor/Destructor
    CTUBE();
    ~CTUBE();

// Output a message to the TUBE
    void Message(const char *szMsg);

// Output a message to the TUBE and Quit
    void ErrMessage(const char *szErrMsg);

// Quit Simulation
    void Exit(void);

// Convert scalar variables to string format ready for TUBE output
    char* HexString    (unsigned int uValue);
    char* BinaryString (unsigned int uValue, int nBits);
    char* IntegerString(int iValue);
};
```

1.1.1.11.10 asicvalidation/vcode/classes/primecell

This directory contains support modules for each of the PrimeCell peripherals that exist within the design:

```
Makefile                    ; Builds classlib_primecell.a (refers
to StdMakefile)
CUART_pl010.hpp
CUART_pl010.cpp             ; Example PL1010 UART peripheral
```

The UART class definition appears as follows:

```
//------------------------------------------------------------------
// CUART_pl010 . CUART_pl010 Class Definition
//
// Purpose      . This is the top level class for a primecell pl010 UART
//
class CUART_pl010 : public SoCObject
{
  public:
    //--- Constructor/Destructor
    CUART_pl010();
    CUART_pl010(unsigned int uBaseAddress, unsigned int IID, unsigned int bIsIRQ, CIRQFIQ*
pIRQFIQ);
    ~CUART_pl010();

// Intialise Class Data
    void InitClass(unsigned int uBaseAddress, unsigned int IID, unsigned int bIsIRQ, CIRQFIQ*
pIRQFIQ);

//--- Member Functions, version and release refers to pl010 revision being used
  private:
    int writeUART_rev1v1(const char char_to_send);   // Checks that write buffer is free
    void putcUART_rev1v1(const char ch);             // Blocking character writes public:
    //--- Member Functions, version and release refers to pl010 revision being used
    int InitUART_rel1v1(unsigned int uBaudRate,
                        unsigned int uWordLength,
                        unsigned int uParity,
                        unsigned int uStopBits,
                        unsigned int uFIFOenable,
                        unsigned int uCRFlags);      // Initialise PL010 UART void UnInitUART_rel1v1(void);                    // UnInitialise PL010 UART int WriteUART_rel1v1(const char *szOutput);      // Output Data via PL010 UART protected:
    // IRQ Callback routine
    virtual void IRQ_Callback(unsigned int uIRQ);

// FIQ Callback routine
    virtual void FIQ_Callback(unsigned int uFIQ);

//--- Member Variables
  private:
    int m_UARTInitialised;    // Initialised Flag
    //volatile struct s_UART *m_pDevice;

PSOCOBJECT m_OldHandler;
    unsigned int m_IID;
    unsigned int m_bIsIRQ;

// Define access to interrupt controller
    CIRQFIQ* m_pIRQFIQ;
};
```

1.1.1.11.11 asicvalidation/vcode/classes/validation

This directory contains any non peripheral specific methods that may be required for tesing. Note that some methods may be a superset of calls and interactions between other system devices such as a sequence of DMA transfers or a 'timeout' utility method that receives a callback if an action ha not completed within the allotted time:

```
Makefile                ; Builds classlib_validation.a (refers
to StdMakefile)
CValTools.hpp
BurstCopy.s
CValTools.cpp           ; Class for test support functions
CMemBurst.hpp
CMemBurst.cpp           ; Memory burst utility is a member of
CValTools
```

1.1.1.11.12 asicvalidation/vcode/classes/asic

The asic class instantiates all the peripheral object definitions and is analogous to a top-level RTL testbench:

```
Makefile                ; Builds classlib_asic.a (refers to
StdMakefile)
GLOBALDEFS.h
CASIC.hpp
CASIC.cpp
```

The asic class definition appears as follows:

```
//---------------------------------------------------------------
-----
// CASIC    . CASIC Class Definition
//
// Purpose  . This is the top level class for CASIC validation,
instantiate
//            your devices in this class using the class library
drivers
//            pertinent to the required device
//
class CASIC : public SoCObject
{
  public:
    //--- Constructor/Destructor
    CASIC();
    ~CASIC();

//--- Exception Handler
    CException EHAND;

//--- Peripherals
    CIRQFIQ IRQFIQ;    // Interrupt dispatcher class
    CCT     FRC1;      // Counter timer 1
    CCT     FRC2;      // Counter timer 2
    CTUBE   Tube;      // Tube output //--- Member Functions
    void StopSimulation();
};
```

The asic class implementation appears as follows. Note that the constructor for this class initialises each of the timer devices present in the example system:

```
//-----------------------------------------------------------------
// Includes
//
include <CASIC.hpp>        // Import CASIC Class Definition //-----------------------------------------------------------------
// Routine . CASIC
//
// Purpose . Standard Constructor
//
CASIC::CASIC()
{
  // Initialise Counter Timers
  FRC1.InitClass(uFRC1Load, IntCntlIRQ_FRC1, IS_IRQ, &IRQFIQ);
  FRC2.InitClass(uFRC2Load, IntCntlIRQ_FRC2, IS_IRQ, &IRQFIQ);
}

//-----------------------------------------------------------------
// Routine . ~CASIC
//
// Purpose . Clean up
//
CASIC::~CASIC()
{
}

//-----------------------------------------------------------------
// Routine . StopSimulation
//
// Purpose . Stop simulation run
//
void CASIC::StopSimulation()
{
  // Call the TUBE Exit function
  Tube.Exit();
}
```

1.1.1.11.13 Putting it all together

With reference to the EASYTestAll module from section 3.4.2.1.4 above, the top level system testing is just a case of referencing the methods required of the system:

```
//--========================================================
//
//   C++ EASY ASIC TestBench Application
//
//--======================================================== define EASYTestAll_cpp

//----------------------------------------------------------
// Includes
//
#include <CASIC.hpp>         // Import ASIC Class Definition
include <CValTools.hpp>     // Validation Tools Library //----------------------------------------------------------
// Routine . Timer1Test
//
// Purpose . Simple Timer Test
//
// The timer decrements much faster than this code can count when the
// timer is running at a Prescale of 0, so timeout will occur naturally
// well after the timer has reached zero and generated an interrupt. If
// an interrupt is detected before the timeout then this test passes.
//
int Timer1Test(CASIC& ASIC)
{
  long iTimeout = 0;                       // Timeout counter
  long iCount   = 0x7ff;                   // Load value/timeout ASIC.Tube.Message("Timer1 IRQ Test...\n");

ASIC.FRC1.AllocateTimer();               // Set up timer with default values
  ASIC.FRC1.SetSingleInterruptMode(TRUE);  // Disable timer after a single interrupt
  ASIC.FRC1.StartTimer(iCount);            // Start timer with iCount load value while (ASIC.FRC1.GetInterruptCount() == 0)
  {
    if (iTimeout++ > iCount) break;        // Check for timeout
  }

ASIC.FRC1.ReleaseTimer();                // Also stops the timer return ASIC.FRC1.GetInterruptCount();
}

//----------------------------------------------------------
// Routine . main
//
// Purpose . TestBench entry point
//
int main()
{
  CASIC     ASIC;       // Create an ASIC object
  CValTools ValTools;   // Create a Validation Tools object // Use the TUBE device to output a message and then quit the simulation
  ASIC.Tube.Message("Validation Toolkit V1.1\n\n");

// Basic Timer 1 Interrupt Test
  if (Timer1Test(ASIC) == 1)
    ASIC.Tube.Message("Passed!\n");
  else
    ASIC.Tube.Message("Failed!\n");

// Exit Simulation
  ASIC.StopSimulation();
}

// __END__
```

Software driver test co-ordinator

1.1.1.12 Methodology

Given the example project as shown in section 3.4.2 above, it is recommended that a similar approach be taken for the FSPM software environment. The following discussion recommends modifications and improvements to the example code directory structure, and introduces the software test co-ordinator structure required to support current and future FSPM software environments.

1.1.1.12.1 Directory Structure

Based on figure 2, note the addition of 3 extra directories: integration, system and xvcs, and the renaming of the vcode/classes/easy directory to vcode/classes/system. These directories will be discussed below. Note also that the asicvalidation directory has been replaced with an IPval directory. Note this is for future naming compatibility:

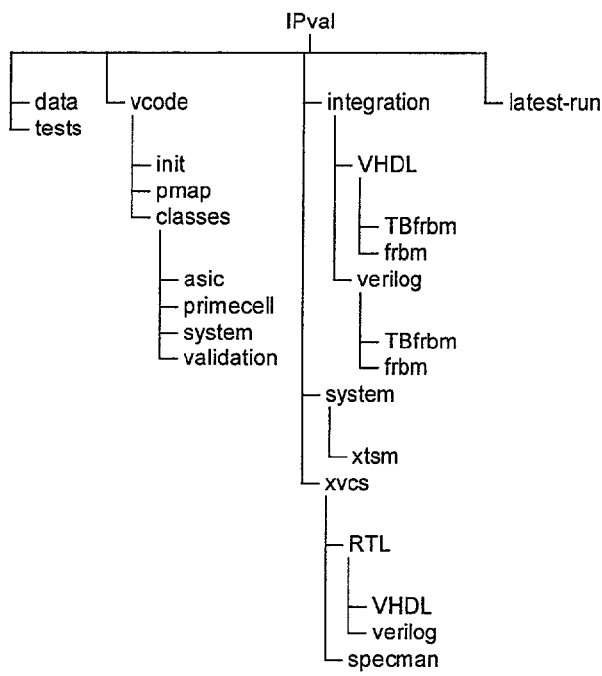

*Figure 3: FSPM integration view directory structure*

1.1.1.12.2 IPval/integration

This directory contains the ADK FRBM RTL, plus a makefile to build the integration test vectors master input file after processing by the enhanced PMAP utility as described above in section 3.3.2.4.2.

1.1.1.12.3 IPval/integration/VHDL/...

This directory contains a VHDL version of the ADK FRBM RTL that will be used to drive the integration vectors through the system. The FRBM is instantiated via a top-level testbench module.

1.1.1.12.4 IPval/integration/verilog/...

This directory contains a Verilog version of the ADK FRBM RTL that will be used to drive the integration vectors through the system. The FRBM is instantiated via a top-level testbench module.

The diagram below in figure 4 shows the first WPS configured with a VHDL/Verilog integration testbench:

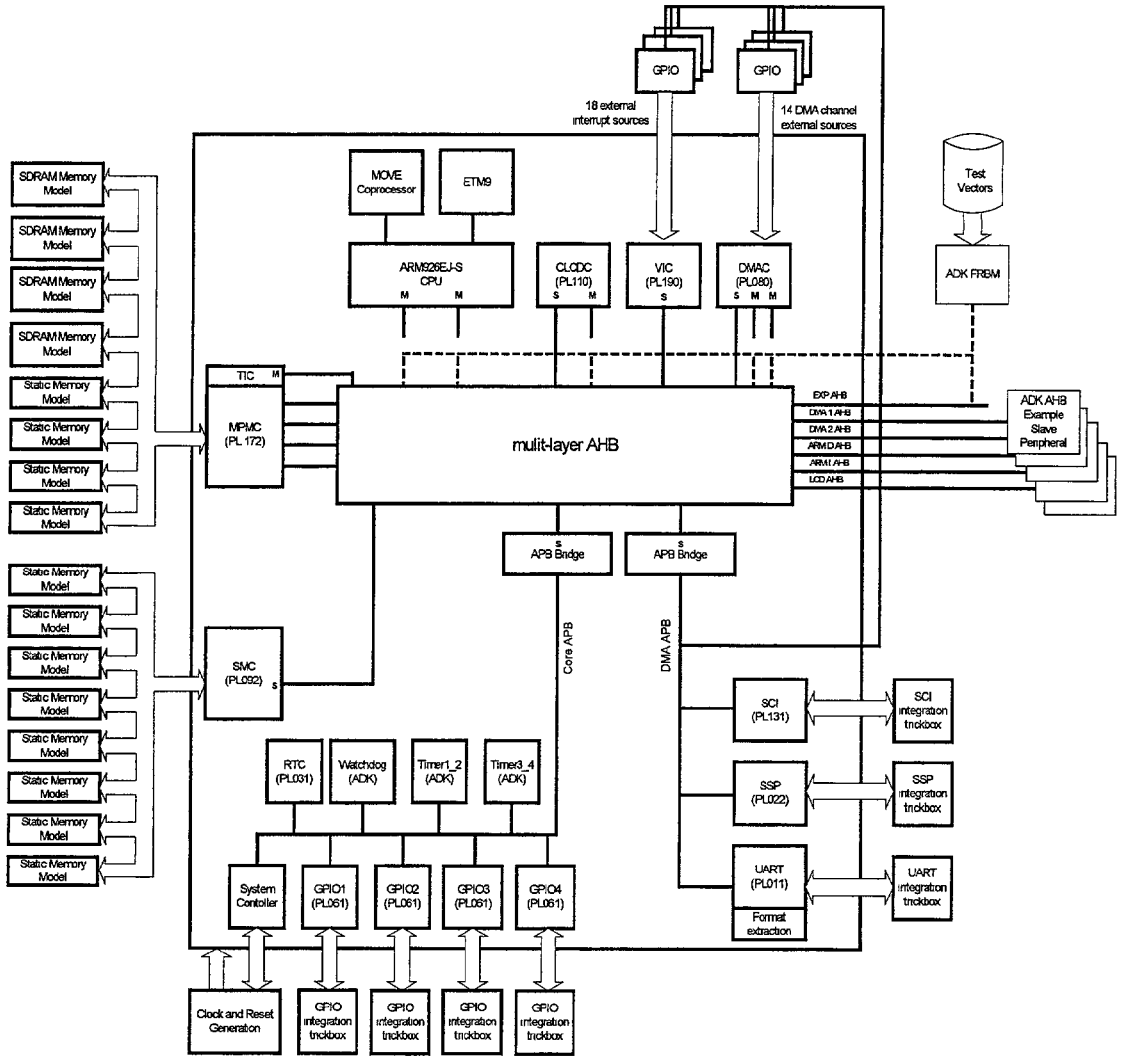

*Figure 4: First WPS integration testbench view*

Note that a number of FRBM instances would need to be created in TBfrbm for the above configuration due to the use of multiple AHBs in the design. The nature of the vectors used would of course be targeted at the scope of the individual FRBM components.

1.1.1.12.5 IPval/integration/xvcs/RTL/...

This directory contains external peripheral interface models, or external verification components (XVC). These are VHDL/Verilog versions that contain little more functionality than a port map. See section 3.4.4 further on for more details.

1.1.1.12.6 IPval/integration/xvcs/specman

This directory contains external peripheral interface models, or external verification components (XVC). These are Specman e language versions that not only contain port maps as in 3.4.3.1.5, but also encapsulate behaviour compatible with the nature of the device they will interface to. See section 3.4.4 further on for more details.

1.1.1.12.7 IPval/integration/system

This directory contains external peripheral interface models, or external verification components (XVC). These are Specman e language versions that not only contain port maps as in 3.4.3.1.5, but also encapsulate behaviour compatible with the nature of the device they will interface to. See section 3.4.4 further on for more details.

1.1.1.12.8 IPval/integration/system/xtsm

This directory contains an external test scenario manager (XTSM), implemented in Specman e code. This module helps the EBFM mentioned below, in co-ordinating stimulus between the external verification components (XVCs), and their host peripherals.See section 3.4.4 further on for more details.

1.1.1.12.9 Principles of FSPM test software operation

The primary reason for this test software infrastructure is to provide a software layer to prove that the system hardware is suitable for sustaining an operating system. This in-turn enables the functional objectives of the platform to be achieved. One important factor is that of verifying that the hardware drivers also function as intended.

It is the software driver test co-ordinator that takes the place of the operating system during the verification process, and as such has direct access to the device driver software API. Where drivers are not yet available, or an API is incomplete, then the software driver test co-ordinator must provide substitute method calls until such a time that the commercial driver suite is fully available.

With the development of external models or XVCs (described further in section 3.4.4 below), both the RTL and the Specman e versions of these XVCs allows the software driver test co-ordinator to not only initialise the driver code using its API, but to stimulate directed I/O to and from the external interface of each system peripheral. The reason for developing both basic reference RTL models, and more complex Specman XVCs is that should a customer not have access to the Specman tool, an alternative method of software verification is still available.

Ultimately the FSPM test co-ordinator will drive both software and hardware test environments to provide a co-validation solution. However for the scope of the first WPS, the software driver test co-ordinator will only exercise the drivers in a directed manner. The next section 3.4.4 describes the nature of the XVCs and how they integrate with the XTSM and the EBFM modules for system level hardware validation.

1.1.1.12.10 Software test co-ordinator usage model (RTL)

Figure 5 shows the testbench environment with the external models mentioned in section 3.4.3.1.5 above for testing software driver initialisation with simple RTL based external models. These models will be developed before the Specman external models and will act as reference RTL. Another advantage of the RTL models is the ability for a non-Specman enabled customer to develop ARM code test routines.

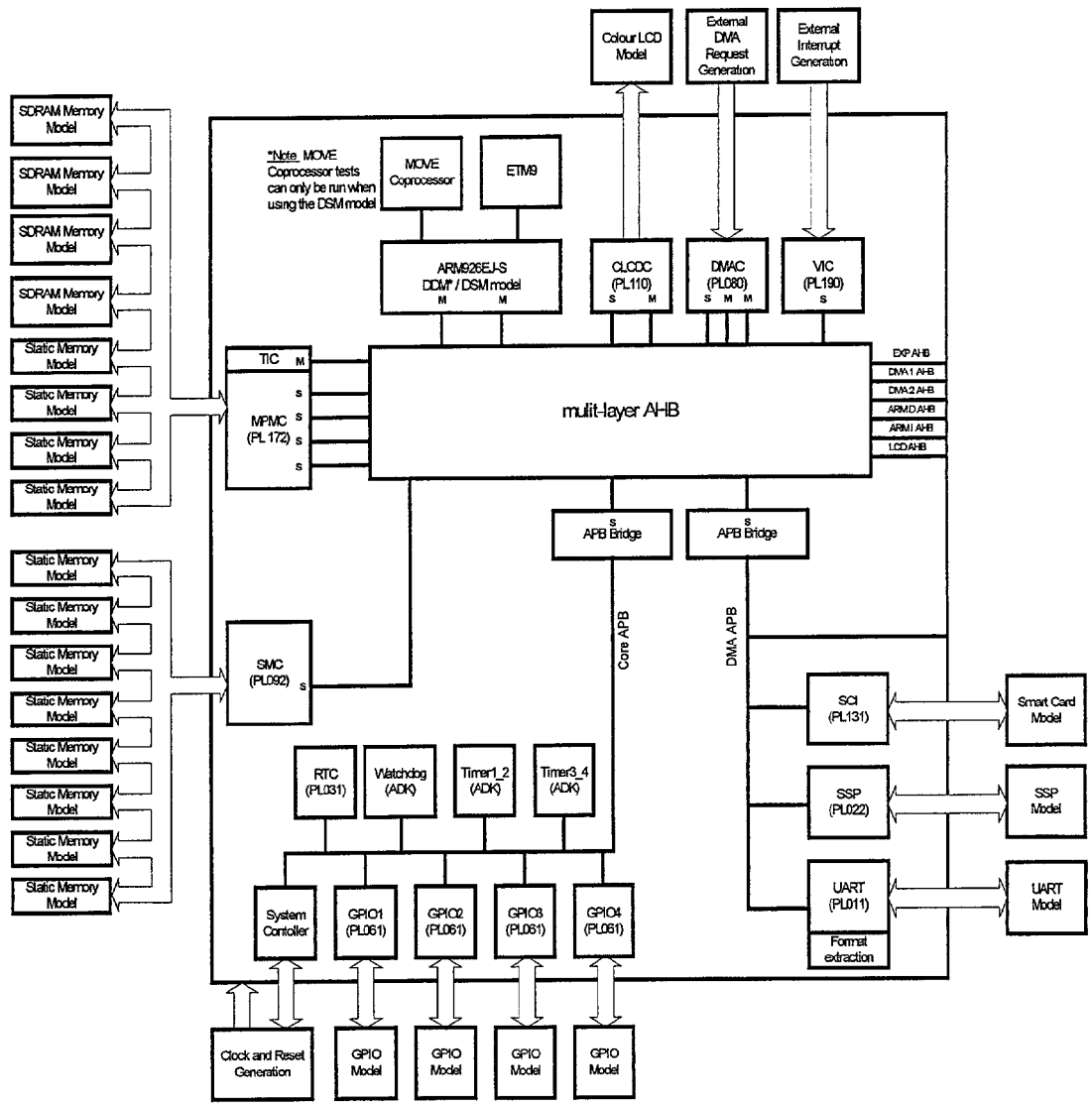

Figure 5: Software driver integration test view using RTL XVCs

1.1.1.12.11 Software test co-ordinator usage model (RTL and Specman)

Figure 6 shows the testbench environment with the external models mentioned in section 3.4.3.1.6 above for testing the software drivers with *fixed responses* from Specman based external models. Note that an ARM core 926 DDM is intended for code development only and will need to be replaced by a 926 DSM for MOVE co-processor testing and customer shipment. These features will enable simple driver I/O calls to be made.

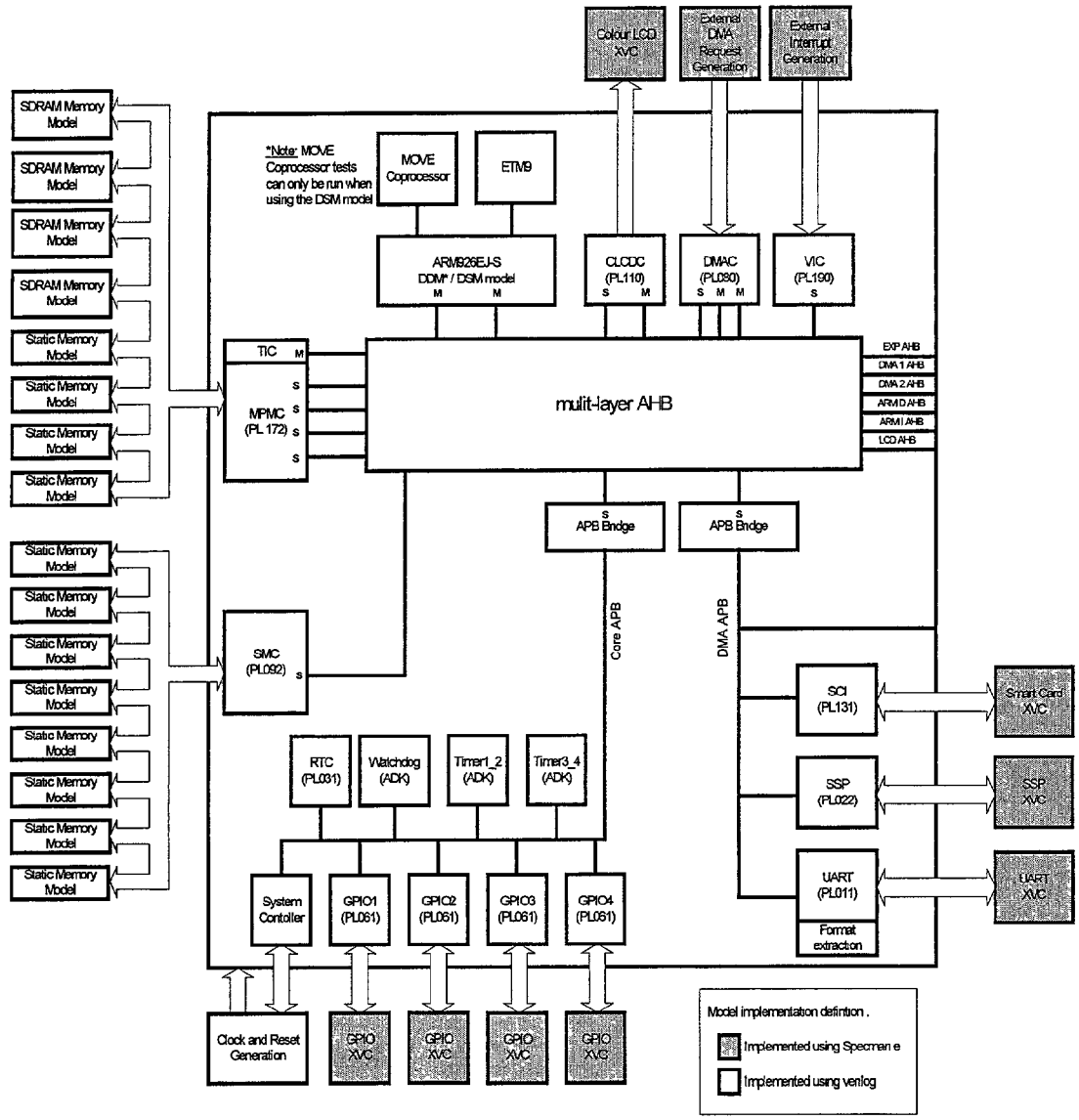

*Figure 6: Software driver test co-ordinator view using Specman XVCs*

1.1.1.13 Software test co-ordinator directory structure

Given discussions in section 3.4.1 about what support modules should be provided, and the example code given in section 3.4.2 we can now map a set of modules to the new 3.4.3.1.1 directory structure:

1.1.1.13.1 IPval/vcode/vcode

Here the top level test code will invoke responses from the external device models as described in section 3.4.4 below. The external models will be pro-programmed to respond to the driver stimulus in such a way that the software drivers can be proven to integrate into the system.

A typical directed test example involving a UART would be to :

- Initialise a UART to generate an interrupt on receipt of a character
- Write a character to the UART Tx register
- The external UART model would then receive this character and transmit a response
- The UART would receive this character in its Rx register and generate an interrupt
- The driver callback function would then be called to service the interrupt In addition the software driver test co-ordinator will call the MOVE co-processor test suite developed during the MOVE co-processor verification project. It is assumed that these test routines can be imported and run without major modification or re-working.

1.1.1.13.2 IPval/vcode/init

This directory contains the boot code modules as described in section 3.4.1.1 above.

1.1.1.13.3 IPval/vcode/pmap

This directory contains pmap files for each of the PrimeCell peripherals in the platform, plus a set of vector files to support integration testing of the device as discussed in section 3.3.2.4.2 above.

1.1.1.13.4 IPval/vcode/classes/asic

As in 3.4.2.1.12 above, this directory contains the top-level ASIC platform peripheral object definitions, and in this way provides an entry point into each of the peripheral driver APIs.

1.1.1.13.5 IPval/vcode/classes/primecell

This directory contains each of the support modules for the platform PrimeCell peripherals. Each support module contains a class that interfaces with the PrimeCell driver C code API. For the first WPS, a class will be created to support each of the following peripherals:

- LCD Controller peripheral (PL110), such that different formats and sizes of image can be displayed across the colour LCD interface (STN/TFT output formats).

- UART peripheral (PL011). An interrupt handler will also enable the receipt of data from this peripheral to be buffered under interrupt.

- GPIO peripheral (PL061), 32 bit I/O functionality.

- Synchronous Serial Port peripheral (PL022), which includes master and slave control, and a DMA facility of the following modes : Motorola SPI, National Semiconductor, Microwire and TI SSI. The DMA support will be programmed via the DMA Manager module.

- Smart-Card Controller (PL130), basic POR and read/write functionality.

A class definition (header) for a UART peripheral support object may look something like:

```
//----------------------------------------------------------------------
// Define C Device Driver Interface Wrappers Here
// ifdef __cplusplus
extern "C" {
endif include "aptypes.h"
include "apos.h"
#include "apuart.h"
#include "uart.h"

#ifdef __cplusplus
}

//----------------------------------------------------------------------
// CUART_pl011 . CUART_pl011 Class Definition
//
// Purpose     . This is the top level test object class for a primecell pl010 UART
//
class CUART_pl011 : public SoCObject
{
  public:
    //--- Constructor/Destructor
    CUART_pl011();
    CUART_pl011(unsigned int uBaseAddress, unsigned int IID, unsigned int bIsIRQ, CVICMgr*
pVICMgr);
    ~CUART_pl011();

// Intialise Class Data
    void InitClass(unsigned int uBaseAddress, unsigned int IID, unsigned int bIsIRQ, CVICMgr*
pVICMgr);

//--- Member Functions, version and release refers to pl010 revision being used
  private:
    int writeUART_rev1v1(const char char_to_send);  // Checks that write buffer is free
    void putcUART_rev1v1(const char ch);            // Blocking character writes
```

```
public:
    //--- Member Functions, version and release refers to pl011 revision being used
    int InitUART_rel1v1(unsigned int uBaudRate,
                        unsigned int uWordLength,
                        unsigned int uParity,
                        unsigned int uStopBits,
                        unsigned int uFIFOenable,
                        unsigned int uCRFlags);     // Initialise PL010 UART void UnInitUART_rel1v1(void);                   // UnInitialise PL010 UART int WriteUART_rel1v1(const char *szOutput);     // Output Data via PL010 UART //--- Test actions supported
    int Action1(int argc, char *argv[]);
    int Action2(int argc, char *argv[]);
    int Action3(int argc, char *argv[]);
    int Action4(int argc, char *argv[]);

//--- Direct Driver Access Support : See apuart.h for documentation
    void apUART_Initialize (apOS_UART_oId Id,
                            apOS_System_eBaseAddress eBase,
                            UWORD32 Interrupts,
                            CONST apOS_INT_oInterruptSource * pSources,
                            CONST apUART_sInitialData *pInitial);
    void apUART_Enable(apOS_UART_oId Id);
    void apUART_Disable(apOS_UART_oId Id);
    apError apUART_TxEnable(apOS_UART_oId Id);
    apError apUART_TxDisable(apOS_UART_oId Id);
    BOOL apUART_TxFIFOEmpty(apOS_UART_oId Id);
    apError apUART_RxEnable(apOS_UART_oId Id);
    apError apUART_RxDisable(apOS_UART_oId Id);
    void apUART_FIFOEnable(apOS_UART_oId Id);
    void apUART_FIFODisable(apOS_UART_oId Id);
    void apUART_ClockFrequencyNotify(UWORD32 Frequency);
    void apUART_BaudRateSet(apOS_UART_oId Id, UWORD32 Rate);
    UWORD32 apUART_BaudRateGet(apOS_UART_oId Id);
    apError apUART_Transmit(apOS_UART_oId Id, void *pBuffer, UWORD32 Size, apUART_rCallback
rCallback);
    apError apUART_Receive(apOS_UART_oId Id, void *pBuffer, UWORD32 Size, apUART_rCallback
rCallback);
    apError apUART_Continue(apOS_UART_oId Id);
    UWORD32 apUART_Read(apOS_UART_oId Id);
    apError apUART_Write(apOS_UART_oId Id, UWORD32 Byte_to_send);
    UWORD32 apUART_Read_N(apOS_UART_oId Id, UBYTE8* pBuffer, UWORD32 Length);
    UWORD32 apUART_Write_N(apOS_UART_oId Id, UBYTE8* pBuffer, UWORD32 Length);
    UWORD32 apUART_TransmitStatusGet(apOS_UART_oId Id);
    UWORD32 apUART_ReceiveStatusGet(apOS_UART_oId Id);
    void apUART_TerminateTransmit(apOS_UART_oId Id);
    void apUART_TerminateReceive(apOS_UART_oId Id);
    void apUART_CallbackSet(apOS_UART_oId Id, apUART_rListener rListener);
    apError apUART_FIFOConfigSet(apOS_UART_oId Id, apUART_sConfigFIFOs *pConfig);
    apError apUART_FIFOConfigGet(apOS_UART_oId Id, apUART_sConfigFIFOs *pConfig);
    void apUART_DataConfigSet(apOS_UART_oId Id, apUART_sConfigData *pConfig);
    void apUART_DataConfigGet(apOS_UART_oId Id, apUART_sConfigData *pConfig);
    void apUART_PowerConfigSet(apOS_UART_oId Id, apUART_sConfigPower *pConfig);
    void apUART_PowerConfigGet(apOS_UART_oId Id, apUART_sConfigPower *pConfig);
    void apUART_IRConfigSet(apOS_UART_oId Id, apUART_sConfigIR *pConfig);
    void apUART_IRConfigGet(apOS_UART_oId Id, apUART_sConfigIR *pConfig);
    apError apUART_DCDConfigSet(apOS_UART_oId Id, apUART_eDCDEnable Config);
    apError apUART_DCDConfigGet(apOS_UART_oId Id, apUART_eDCDEnable *pConfig);
    apError apUART_RIConfigSet(apOS_UART_oId Id, apUART_eRIEnable Config);
    apError apUART_RIConfigGet(apOS_UART_oId Id, apUART_eRIEnable *pConfig);
```

```
    apError apUART_RTSConfigSet(apOS_UART_oId Id, apUART_eRTSEnable Config);
    apError apUART_RTSConfigGet(apOS_UART_oId Id, apUART_eRTSEnable *pConfig);
    apError apUART_DTRConfigSet(apOS_UART_oId Id, apUART_eDTREnable Config);
    apError apUART_DTRConfigGet(apOS_UART_oId Id, apUART_eDTREnable *pConfig);
    void apUART_TxIntEnable(apOS_UART_oId Id);
    void apUART_TxIntDisable(apOS_UART_oId Id);
    void apUART_RxIntEnable(apOS_UART_oId Id);
    void apUART_RxIntDisable(apOS_UART_oId Id);
    apError apUART_ModemIntSet(apOS_UART_oId Id, UWORD32 Modemmask);
    void apUART_ModemIntGet(apOS_UART_oId Id, UWORD32 *pModemmask);
    UWORD32 apUART_ModemStatusGet(apOS_UART_oId Id);
    apError apUART_ErrorIntSet(apOS_UART_oId Id, UWORD32 Errormask);
    apError apUART_ErrorIntGet(apOS_UART_oId Id, UWORD32 *pErrormask);
    void apUART_ErrorStatusClear(apOS_UART_oId Id);
    UWORD32 apUART_ErrorStatusGet(apOS_UART_oId Id);

protected:
    // IRQ Callback routine
    virtual void IRQ_Callback(unsigned int uIRQ);

// FIQ Callback routine
    virtual void FIQ_Callback(unsigned int uFIQ);

//--- Member Variables
private:
    int m_UARTInitialised;   // Initialised Flag
    //volatile struct s_UART *m_pDevice;

PSOCOBJECT m_OldHandler;
    unsigned int m_IID;
    unsigned int m_bIsIRQ;

// Define access to interrupt controller
    CVICMgr* m_pVICMgr;
};
```

1.1.1.13.6 IPval/vcode/classes/system

This directory contains the system software managers; namely the Interrupt Handler (section 3.4.1.2), the DMA Manager (section 3.4.1.3) and the System Function Manager (section 3.4.1.3). Each of these modules will be encapsulated it it's own class such that the top level software driver test co-ordinator can instantiate them and make use of the facilities that they provide.

1.1.1.13.7 IPval/vcode/classes/validation

This directory contains a class library of any useful verification related tasks such as memory test routines and timeout procedures. This class makes use of the classes in 3.4.3.2.6 to provide as constructs for higher level verification tasks.

1.1.1.13.8 Software verification structure: Object interconnectivity

Figure 7 below shows the logical structure of each of the objects and how they might interact. Each of the external blocks listed for VIC, DMAC, SCI, CLCD, SSP, UART, and GPIO all connect to a corresponding Specman XVC:

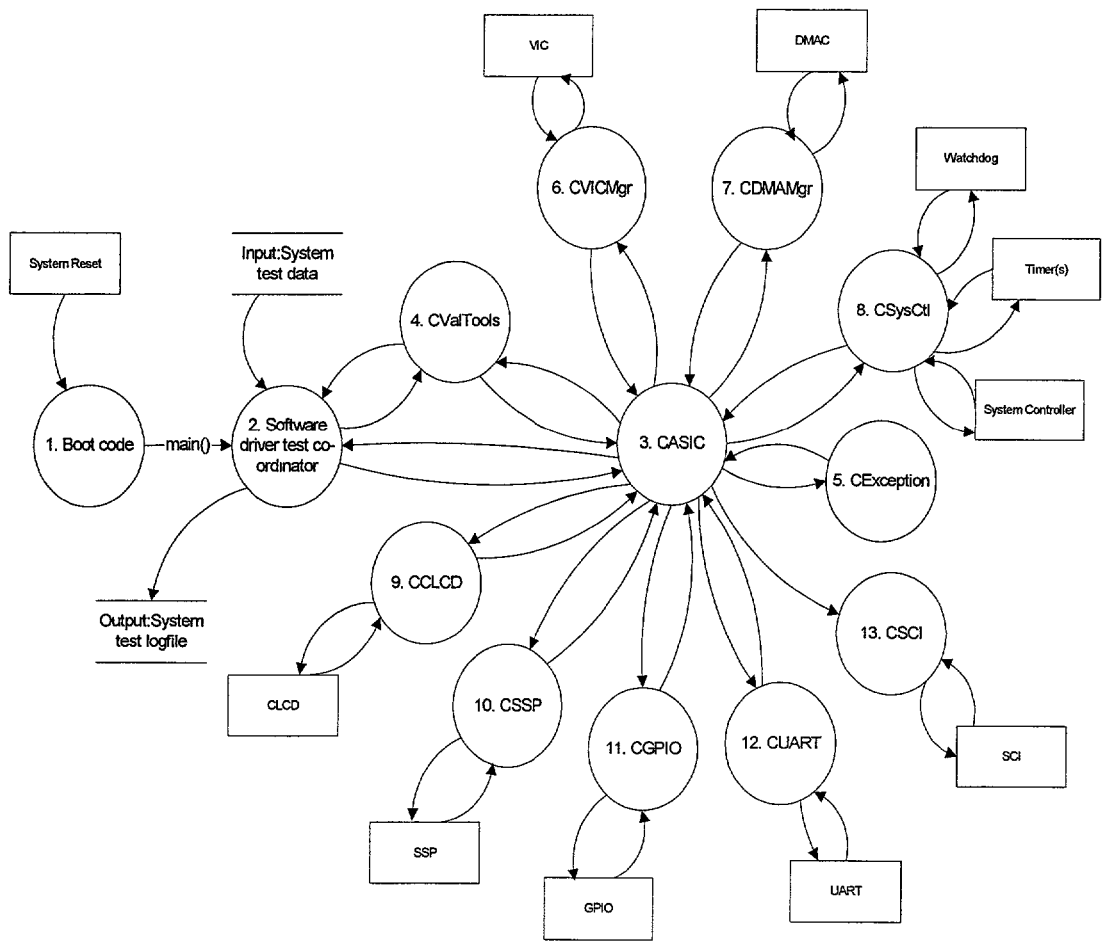

*Figure 7:Software driver test co-ordinator object view*

1.1.1.13.9 Software verification structure: Main software driver test co-ordinator object From Figure 7 above, we can see that object *2.Software driver test co-ordinator* is responsible for instantiating and communicating with the platform under test (represented in software by the class CASIC). This class would contain the directed test member functions, and would call each in turn. VIC, DMAC, SCI, CLCD, SSP, UART

```
//-----------------------------------------------------------------
// Defines and Macros
//
#ifdef STOP_ON_ERROR
   #define ERROR_SEQ ASIC.StopSimulation();
#elseif
   #define ERROR_SEQ ;
endif define MAX_TESTS       6 define OUT             ASIC.Tube.Message
define ASSERT_TEST(x,y) {y = x; if ((y)==1){(OUT("Passed!\n");} else
{OUT("Failed!\n");ERROR_SEQ;}}

//-----------------------------------------------------------------
// Routine . main
//
// Purpose . TestBench entry point
//
int main()
{
   CASIC      ASIC;       // Create an ASIC object
   CValTools ValTools;    // Create a Validation Tools object // Use the TUBE device to output a message and then quit the simulation
   OUT("Platform Verification Kernel : Software driver test co-ordinator v1.0a\n\n");

int iResults[MAX_TESTS];
   int iCurrentTest = 0;

// Initiate basic test sequences
   ASSERT_TEST(VIC_Test(ASIC)  , iResults[iCurrentTest++]);
   ASSERT_TEST(DMAC_Test(ASIC) , iResults[iCurrentTest++]);
   ASSERT_TEST(SCI_Test(ASIC)  , iResults[iCurrentTest++]);
   ASSERT_TEST(CLCD_Test(ASIC) , iResults[iCurrentTest++]);
   ASSERT_TEST(SSP_Test(ASIC)  , iResults[iCurrentTest++]);
   ASSERT_TEST(UART_Test(ASIC) , iResults[iCurrentTest++]);

// Check run
   for (int i=0,iPasses=0; i<MAX_TESTS; i++){iPasses += iResults[i];}
   OUT(IntegerString(iPasses)); OUT(" of "); OUT(IntegerString(i)); OUT(" tests passed.\n");

// Exit Simulation
   ASIC.StopSimulation();
}

// End module
```

1.1.1.13.10 Software verification structure: The next step, Scenarios and Actions A co-verification solution can be created for FSPM by enhancing the concept of the software driver test co-ordinator. Here a task scheduler object would be introduced that enabled concurrent driver tests to be exercised, at the same time as taking interrupts and data from XVCs. So far, all of the tests mentioned above are directed in that a test is started in sequential order, and its results checked by using register access and data checking.

*Scenarios* are when a prescribed set of peripheral interactions are initiated in such a manner as software concurrency is compounded by external interrupt and DMA requests. In this way both an operating system and real-world operating conditions can be emulated.

In order for some random element to be introduced into the ordering of the interrupts, each scenario is composed of a sequence of *actions*, each of which is a self-checking software/device interaction. It is intended that each software component and each XVC has a co-ordinated set of actions that can be 'played' between them.

It would be the job then of the scheduler to queue sequences of selected actions for each peripheral in the system. An action can be initiated either by an external event occurring from an XVC, or by a software driver test module streaming data into it's corresponding XVC. The progress of each action is closely monitored such that when a system error occurs, each of the software driver states and its list of corresponding action numbers can be output to aid debugging.

External verification components

As mentioned in 3.4.3.1.5 and 3.4.3.1.6, there are two variants of XVC, one written in RTL, and the other in Specman e language. The RTL variant is intended as a reference model only and contains little more than a port map, and perhaps a monitoring task/process for data/control lines to the peripheral. Additional functionality would only be added to the RTL XVCs where a customer specifically states that Specman is not a requirement for their FSP.

1.1.1.14 Verilog RTL XVC reference model example

The code section below outlines such a Verilog XVC for the Colour LCD Controller PrimeCell (PL110). Note that the Verilog code for this particular XVC monitors the line and frame pulse signals, along with the pixel clock and AC bias signal :

```
// ----------------------------------------------------------------------
// Purpose: This CLCD XVC module sits at the receiving end of the Data bus out from
//          the LCD controller and also takes in the following control signals
//          which would have gone to the LCD panel (from the Timing Controller):
//             1. LinePulse and Frame pulse,
//             2. Pixel clock, and
//             3. AC Bias signal.
// ----------------------------------------------------------------------

`timescale 1ns/1ps module CLCD_XVC (CLPOWER, CLLP, CLCP, CLFP, CLAC, CLD, CLLE, panelClk);
    input CLPOWER;              // LCD power enable       from Timing Controller
    input        CLLP;          // Line pulse signal      from Timing Controller
    input        CLCP;          // Clock input            from MUX / Panel clock generator
    input        CLFP;          // Frame pulse signal        from Timing Controller
    input        CLAC;          // AC Bias(STN)/Data Enable(TFT) from Timing Controller
    input [23:0] CLD;           // Panel data             from MUX
    input        CLLE;          // Line end signal        from Timing Controller
    input        panelClk;
// =========================== Wire declarations ===========================
// . . .
// =========================== Register declarations =======================
// . . .
// =========================== Initial process ============================
initial
begin
// . . .
end
// =========================== Main body ==================================
// . . .
endmodule // Peek
// =========================== End ========================================
```

1.1.1.15 Specman XVC reference model overview

Specman based XVCs will have more functionality than their corresponding RTL variants. There are three main identifiable components of each external model:

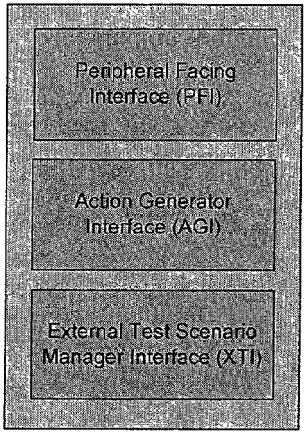

*Figure 8: XVC logical components*

1.1.1.16 Specman XVC reference model overview : Peripheral Facing Interface (PFI)

The peripheral facing interface acts as an abstraction layer between the physical interface and the action generator component. The abstraction layer provides a set of basic read/write/delay/poll constructs each with an associated timeout mechanism. This interface will also have two identifiable attributes:

- Cycle accurate (pin) driver for device connection at RTL

- Transaction accurate driver for modelling the XVC at a higher level of abstraction, i.e. ARMulator

- Depending on how the model is initialised, either the transaction level or the pin level driver will be activated such that the abstraction level can be modified at run-time.

1.1.1.17 Specman XVC reference model overview : Action Generator Interface (AGI)

This component connects between the PFI (3.4.4.3) and the XTI (3.4.4.5). Actions are defined having an ID number, and a sequence of calls to the peripheral driver interface. Any data or protocol errors detected at this stage during execution of an action are passed up to the external model scenario manager (3.4.5), which stops the simulation after reporting any pertinent debug information. Notable AGI attributes then are:

- Action 'store' for retaining sequences of device I/O to be played back on demand

- Self checking mechanism for Actions

- Annotation facility including error reporting during Action replay

Note: Where possible, each XVC starts with a default action sequence to wait for a write from its host peripheral. The response provided by the XVC to the host peripheral is fixed. See section 3.4.4.6 below for a description of XVC operating modes.

1.1.1.18 Annotation notes : Message error levels

Simulator messages from each XVC are passed using an event mechanism to the XTSM as described in the section below. There should be 3 levels of message severity : ERROR, WARNING, COMMENT. A message that reports an error condition should optionally trigger a simulation halt.

1.1.1.19 Specman XVC reference model overview : External Test Scenario Manager Interface (XTI)

This interface holds state and control information about the external model, and is responsible for receiving and executing action requests from the XTSM (3.4.5). This interface component initiates and monitors the execution progress of the current action (3.4.4.4), and informs the external model scenario manager that it is ready for the next action. Command packets received from the XTSM would have a format similar to that shown below in figure 9:

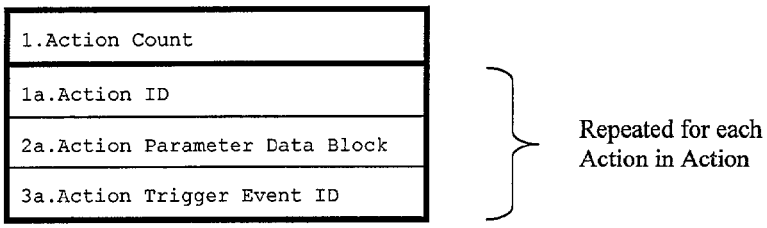

*Figure 9: XVC:XTI input packet format from XTSM*

The action parameter data block above in field 2a. of figure 9 will take the form of a linked list of structures, each structure containing a scalar value of relevance to its associated Action ID to be processed. Return status information from the XTI is encoded in a single status structure:

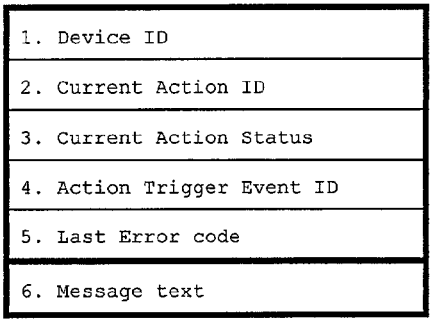

*Figure 10: XVC:XTI status packet format from XTSM*

The XTI is also responsible for receiving action synchronisation events, and generating status events such that the status structure can be read from the XTSM. Some typical events are listed in the table below, this is not a complete list however:

| Event | Direction | Comments |
|---|---|---|
| Trigger event ID fired | In | A system event has been detected, XTI to check ID |
| Stop Run | In | Suspend action processing |
| Action Complete | Out | Current Action completed XTSM to read status |
| Action Sequence Complete | Out | Current list of Actions completed XTSM to read status |
| Device Error Detected | Out | I/O Error/Timeout detected XTSM to read status |
| Message Waiting | Out | Annotation text available XTSM to read status |

1.1.1.20 Specman XVC reference model overview: Operating Modes

XVCs have two distinct operating modes, either active or passive. In passive mode, the XVC will respond to fixed stimulus and respond with fixed stimulus. This functionality is tightly coupled to the supporting software object (section 3.4.3.2.5) that is driving the XVC's host peripheral. This basic level of functionality is simply for the test software to exercise software driver configuration and API.

In active mode, the XVC's XTI is used to provoke actions between the XVC and it's host peripheral. An action in this context is either a 'wait and respond' or a 'drive' interaction.

When an XVC is instantiated, it waits for an input packet from the XTSM, otherwise it remains in passive mode. This has the added advantage that not all XVCs need to be initialised in a system for a particular test run, but simply return fixed data to I/O requests from their host peripherals.

1.1.1.21 Example Top level Specman code for a CLCD XVC

Figure 11 below shows the PL110 CLCD interfacing with a CLCD XVC. When a peripheral is programmed via its supporting software object, the XVC provides both input and output to the peripheral to close the verification loop. In the case of the CLCD however, the XVC just monitors the outputs from the CLCD controller:

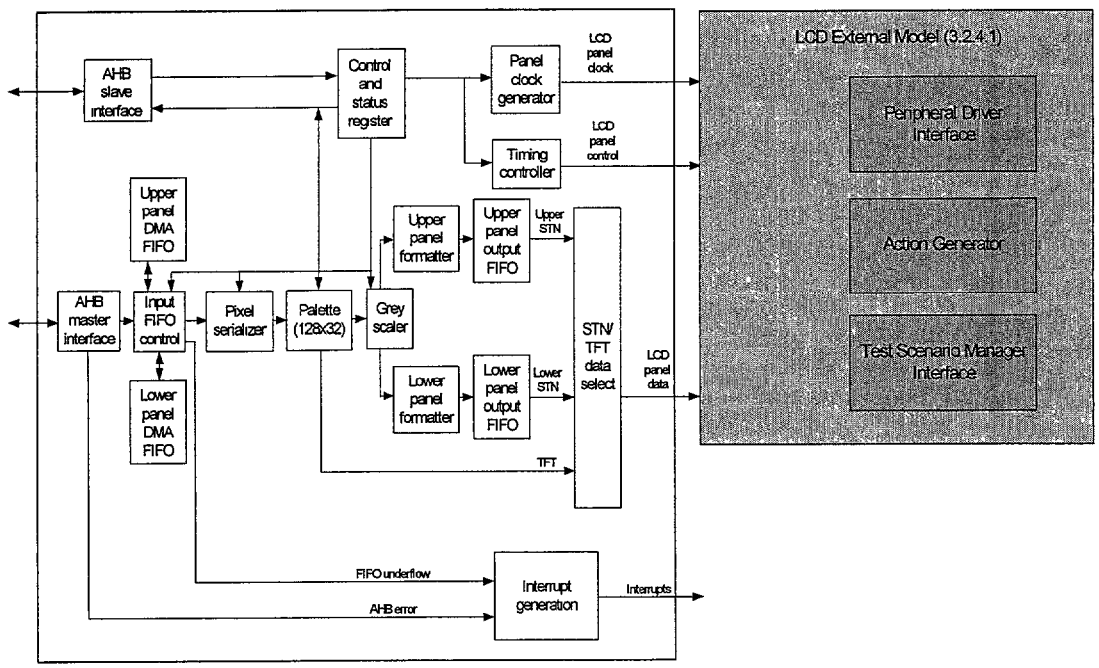

*Figure 11: CLCD Controller XVC*

The sample code below is a top level Specman definition for an XVC. Even though the above example shows a CLCD controller XVC, the basic declaration holds for all XVCs. First the base classes must be defined:

```
<'
//----------------------------------------------------------------------
// XVC: External Verification Component Declaration XVC_base.e
//----------------------------------------------------------------------
// Imports
//----------------------------------------------------------------------
import XVC_defines;
import XVC_transaction_interface;
//----------------------------------------------------------------------
// Base Struct for XVC
//----------------------------------------------------------------------
struct XVC {
    //----------------------------------------------------------------------
    // XVC Identification : Set by parent object
    //----------------------------------------------------------------------
    fsp_config: FSP_config;
    name: FSP_name;
      keep soft FSP_name == "";
    id: XVC_id;
      keep soft id == 0;
    p_xtsm: XTSM; // Pointer to External Test Scenario Manager
        keep p_xtsm == get_enclosing_unit(XTSM);
    //----------------------------------------------------------------------
    // PFI instantiation : Peripheral facing interface
    //----------------------------------------------------------------------
    RTL_level: bool;
        keep soft not RTL_level;
    host_periph_kind: XVC_peripheral_kind;
        keep soft host_periph_kind == GENERIC_PERIPH;
    transaction_interface:
        keep transaction_interface.name == name;
        keep transaction_interface.id == id;
        keep transaction_interface.host_periph_kind == host_periph_kind;
        keep transaction_interface.RTL_level == RTL_level;
    //----------------------------------------------------------------------
    // AGI instantiation : Action Generator Interface
    //----------------------------------------------------------------------
    agi : XVC_AGI is instance;
       keep agi.name    == name;
       keep agi.id      == id;
       keep agi.p_xtsm  == p_xtsm;
       keep agi.trans_if == transaction_interface;
    //----------------------------------------------------------------------
    // XTI instantiation : External Test Scenario Manager Interface
    //----------------------------------------------------------------------
    xti : XVC_XTI is instance;
       keep xti.name == name;
       keep xti.id   == id;
       keep xti.agi  == agi;
       keep host_periph_kind == host_periph_kind;
};// XVC
'>
```

A top level defines and types file is required as included by the XVC base structure module above:

```
<'
//-----------------------------------------------------------------
// General Types and Defines
//-----------------------------------------------------------------
type FSP_name:  [FSP_NAME_DEFAULT = UNDEF]; // Extend in top module
type XVC_id:    [XVC_ID_DEFAULT   = UNDEF]; // Extend in top module // XVC_peripheral_kind - XVC type enumeration
type XVC_peripheral_kind: [GENERIC_PERIPH
                          ,CLCD_PERIPH
                          ];// XVC_peripheral_kind
//...
'>
```

Note that the transaction interface is programmed via the AGI and drives either one of the XVC_pin_driver or the XVC_transaction_driver. The API for the XVC_transaction_interface *must* be published such that the AGI actions can be extended by the user.

```
<'
//-----------------------------------------------------------------
//  Peripheral Facing Interface : XVC_pin_driver
//-----------------------------------------------------------------
unit XVC_pin_driver {
    name: FSP_name;
    id: XVC_id;
    // Type of host peripheral
    host_periph_kind : XVC_peripheral_kind;
        keep soft host_periph_kind == GENERIC_PERIPH;
    // Generic Port Driving functions (to be extended)
    when GENERIC_PERIPH'host_periph_kind {
        read_port() is empty;
        write_port() is empty;
        poll_port() is empty;
        delay() is empty;
    };// when GENERIC_PERIPH
};// XVC_pin_driver
'>
<'
//-----------------------------------------------------------------
//  Peripheral Facing Interface : XVC_transaction_driver
//-----------------------------------------------------------------
unit XVC_transaction_driver {
    name: FSP_name;
    id: XVC_id;
    // Type of host peripheral
    host_periph_kind : XVC_peripheral_kind;
        keep soft host_periph_kind == GENERIC_PERIPH;
    // Generic Port Driving functions (to be extended)
    when GENERIC_PERIPH'host_periph_kind {
        read_port_from_file() is empty;
        write_port_to_file() is empty;
        poll_port_from_file() is empty;
        delay() is empty;
    };// when GENERIC_PERIPH
};// XVC_transaction_driver
'>
```

```
<'
//----------------------------------------------------------------
// Peripheral Facing Interface : XVC_transaction_interface
//----------------------------------------------------------------
// Imports
//----------------------------------------------------------------
import XVC_pin_driver;
import XVC_transaction_driver;
//----------------------------------------------------------------
// AGI Interface layer
//----------------------------------------------------------------
unit XVC_transaction_interface {
    name: FSP_name;
       keep soft FSP_name == "";
    id: XVC_id;
       keep soft id == 0;
    RTL_level: bool;
       keep soft not RTL_level;
    host_periph_kind: XVC_peripheral_kind;
       keep soft host_periph_kind == GENERIC_PERIPH;

// Instantiate RTL_level pin driver
    when RTL_level XVC {
       pin_driver : XVC_pin_driver is instance;
          keep pin_driver.name == name;
          keep pin_driver.id == id;
          keep pin_driver.host_periph_kind == host_periph_kind;
    };// RTL_level // Instantiate transaction driver
    when FALSE'RTL_level XVC {
       transaction_driver : XVC_transaction_driver is instance;
          keep transaction_driver.name == name;
          keep transaction_driver.id == id;
          keep transaction_driver.host_periph_kind == host_periph_kind;
    };// FALSE RTL_level //----------------------------------------------------------------
    // Define API to drive the Peripheral Facing Interface
    //----------------------------------------------------------------
    // Pin driver implementation
    when RTL_level XVC {
      //... method_a() is {
      //...    pin_driver.func_a();
      //... };
    };// RTL_level // Transaction level implementation
    when FALSE'RTL_level XVC {
      //... method_a() is {
      //...    transaction_driver.func_a();
      //... };
    };// FALSE RTL_level
};// XVC_transaction_interface
'>
```

The AGI will interface directly with the transaction interface of the PFI, and holds transaction sequence information to define actions to be executed:

```
<'
//-----------------------------------------------------------------
// Action Generator Interface Definition
//-----------------------------------------------------------------
unit XVC_AGI {
    name: FSP_name;
    id: XVC_id;
    trans_if: XVC_transaction_interface;
    events_list : list of XVC_Event_Info;  // Updated via XTI interface
    p_xtsm: XTSM;                           // Pointer to External Test Scenario Manager assigned by
XVC
    // Wait for XTI event to occur
    new_xtsm_event() is empty;              // events_list has just been updated via XTI
    //-----------------------------------------------------------------
    // Action Sequences
    //-----------------------------------------------------------------
    execute_action(idAction:int, action_data: XVC_action_data) is {
        event_info : XVC_Event_Info;
        case idAction {
          1: {
              // Write to trans_if for I/O
              // Generate Events back to XTSM using p_xtsm.queue_event(event_info);
              //...
          };// Action 1
          default: {};
        };// case idAction
    };// execute_action
};// XVC_AGI
'>
```

The XTI in turn connects to the AGI, and interfaces the XVC to the XTSM:

```
<'
// ...

//-----------------------------------------------------------------
// XTI_input_packet : From XTSM to AGI
//-----------------------------------------------------------------
struct XTI_input_packet {
    action_id       : XVC_action_id;        // AGI Action id to execute
    action_data     : XVC_action_data;      // Data block associated with this action
    action_event_id : XVC_action_event_id;  // External event that starts this action
executing
};// XTI_input_packet //-----------------------------------------------------------------
// XTI_status_packet : To XTSM via AGI
//-----------------------------------------------------------------
struct XTI_status_packet {
    current_action_id     : XVC_action_id;        // Current AGI Action being executed
    current_action_status : XVC_action_status;    // AGI Action Status
    action_event_id       : XVC_action_event_id;  // External event that starts/started this action
    last_error            : uint;                 // Last device error code encountered
    message_text          : string;               // Current message text from AGI
};// XTI_status_packet // ...
'>
<'
//-----------------------------------------------------------------
// External Test Scenario Manager Interface
//-----------------------------------------------------------------
unit XVC_XTI {
    name: FSP_name;
    id: XVC_id;
    host_periph_kind: XVC_peripheral_kind;
        keep soft host_periph_kind == GENERIC_PERIPH;

// Action Generator Interface
    agi: XVC_AGI;

// XTSM Interface functions
    new_scenario(ipp: XTI_input_packet) is empty;
    get_message() : string is empty;
    get_status() : XTI_status_packet is empty;
    queue_event(event_info : XVC_Event_Info) is empty;   // Events received by XTSM, add to
agi.events_list
                                                          // and then call agi.new_xtsm_event();
    peek_XTSM_events() is empty;                          // Read events queue TCM // Start XVC event queue monitoring
    run() is also {
      peek_XTSM_events();
    };// run()
};// XVC_XTI
'>
```

Finally we can extend the base classes/structures to give us our CLCD XVC:

```
<'
//-----------------------------------------------------------------------
// XVC: CLCD External Verification Component Declaration
//-----------------------------------------------------------------------
// Imports
//-----------------------------------------------------------------------
import XVC_base;

//-----------------------------------------------------------------------
//  Extend base Struct for CLCD PFI
//-----------------------------------------------------------------------
extend CLCD XVC_pin_driver {
    smp : CLCD_signal_map;
        keep smp == get_enclosing_unit(XVC).fsp_config.clcd_smp;
    clcd_init() is empty;
};// CLCD XVC_pin_driver extend CLCD XVC_transaction_driver {
    clcd_init() is empty;
};// CLCD XVC_transaction_driver extend CLCD XVC_transaction_interface {
    // Pin driver implementation
    when RTL_level XVC {
      clcd_init() is {pin_driver.clcd_init();};
    };// RTL_level
    // Transaction level implementation
    when FALSE'RTL_level XVC {
      clcd_init() is {transaction_driver.clcd_init();};
    };// FALSE RTL_level
};// CLCD XVC_transaction_interface //-----------------------------------------------------------------------
// Extend base Struct for CLCD AGI
//-----------------------------------------------------------------------
extend CLCD XVC_AGI {
    //-----------------------------------------------------------------------
    //  Action Sequences
    //-----------------------------------------------------------------------
    execute_action(idAction:int, action_data: XVC_action_data) is only {
        event_info : XVC_Event_Info;
        case idAction {
          1: {
              // Write to trans_if for I/O using CLCD monitor API
              // Generate Events back to XTSM using p_xtsm.queue_event(event_info);
              trans_if.clcd_init();
            };// Action 1
          default: {};
        };// case idAction
    };// execute_action
};// CLCD XVC_AGI
'>
```

System Level Validation

The type of testing being described above was *system level functional verification*. This section describes the requirements for *system level validation*, in which the actual design intent of the system is tested.

The first implementation of this validation phase requires that system scenarios are generated and compiled into an input file that is driven onto the an AHB in the form of transactions as in the integration testing introduced in section 3.3. The input file will be an enhanced vector format file (see section 3.3.2 for the standard definition), which will contain additional action sequencing and synchronisation commands. As mentioned above (section 3.4.3.2.10), actions are themselves sequences of IO operations to be performed on a given peripheral.

XVC Test scenario Manager (XTSM) overview

As shown in section 3.4.6 figure 13, the external model test scenario manager will interface to the XVCs and the AHB Master XVC. In this way, system test vectors can be synchronised with the external models such that simultaneous system events can be generated. The basic functionality of the the external model test scenario manager and the AHB Master XVC is shown in the data-flow diagram in figure 12 below:

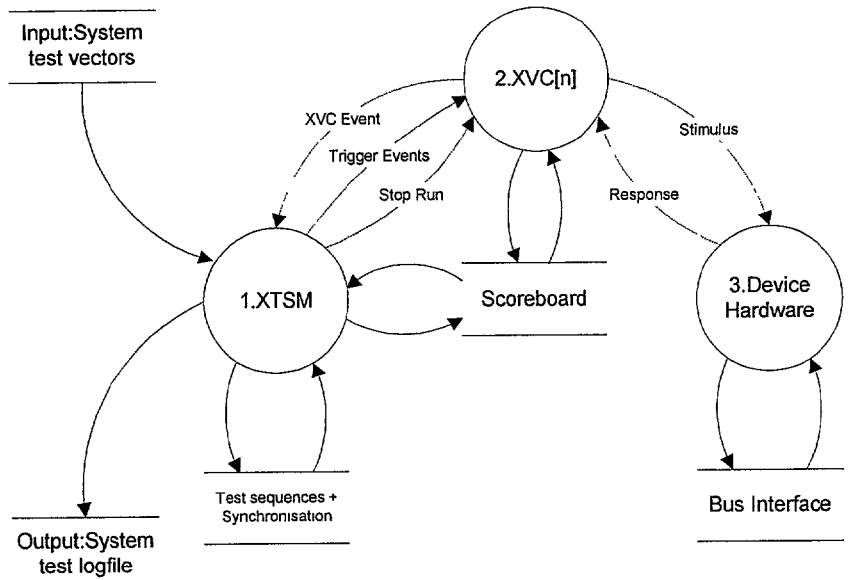

*Figure 12: XTSM logical components*

Handling Timeouts

One method of synchronising events is to have a generic 'timing' XVC; i.e. an XVC that is not physically connected to a corresponding device, but simply has an XTI and an AGI for communication with the XTSM. At the start of simulation, this XVC can have a selected action to generate a timing pulse at a set frequency. The timing events will notify the XTSM via an appropriate event as described in the *External Test Scenario Manager Interface (XTI)* section above. For example an Action Complete event would fire each time a timer interval was reached (unless of course it were a one-shot event). Similarly it may be desirous to use a Device error Detected event to signify a system timeout, in this case the timing XVC would act as a watchdog.

Stop Run Mechanism

The *External Test Scenario Manager Interface (XTI)* section above describes a single Stop Run event coming in from the XTSM. This event is typically used as a result of an error or timeout condition being met in one of the XVCs; in this case then an exit condition is generated where all XVC action processing is suspended. However, there may be requirement for a legitimate non-error system stop such that if a particular system event or coverage goal is reached. In the latter case a graceful stop is required i.e. action sequences run to completion. Such an example of an AHB Master XVC in this instance would be complete it's current burst and return to IDLE transfers ( the master is de-granted).

1.1.1.22 Example Top level Specman code for an XTSM

An XTSM acts as a container for a list of XVCs, it is the job of this 'container' to ensure that communication from the stimulus input file being driven on the bus by the AHB Master XVC (described in section 3.5.2 below), reaches each of the target XVCs. It also ensures that each XVC is synchronised by passing events between them.

```
<'
//----------------------------------------------------------------
// External Test Scenario Manager
//----------------------------------------------------------------
unit XTSM {
    name: FSP_name;
    fsp_config: FSP_config;
    p_fsp_env: FSP_env; // Pointer to Parent Environment
      keep p_fsp_env == get_enclosing_unit(FSP_env);
    RTL_level: bool;
      keep soft not RTL_level;

xvcs: list of XVC is instance;
      keep xvcs.size() == fsp_config.xvcs.size();
      keep for each in xvcs {
          .name           == FSP_name;
          .id             == fsp_config.get_periph_id(index).as_a(XVC_id);
          .host_periph_kind== fsp_config.get_periph_kind(index);
          .RTL_level      == RTL_level;
          .fsp_config     == fsp_config;
      };// keep !xvc_in:  XTI_input_packet;
    !xvc_out: XTI_status_packet;
    !state: XTSM_state;
    events_list : list of XVC_Event_Info;

// Support Methods
    new_scenario(id: XVC_id, ipp: XTI_input_packet) is empty;
    get_message(id: XVC_id): string is empty;
    get_status(id: XVC_id): XTI_status_packet is empty;
    queue_event(event_info : XVC_Event_Info) is empty;  // Events received by XVC AGI components
```

```
    peek_XVC_events() is empty;                          // Read events queue TCM
    start_run() is empty;
    stop_run() is empty;
    get_state(state: XTSM_state) is empty;
    log_state(state: XTSM_state) is empty;
    FSP_env_event(xtsm_event: XTSM_event) is empty;      // Handle events generated by parent
environment // Start XVC event queue monitoring
    run() is also {
      wait true(@start_run);
      start peek_XVC_events();
    };// run()
};// XTSM
'>
```

AHB Master XVC/XTSM interaction overview

Figure 13 below shows three AHB Master XVCs connected to the XTSM. The AHB Master XVCs are based on the functionality provided by the ADK FRBM (section 3.3.2). The XTSM System test vectors are used to invoke actions to be replayed by any of the XVCs. Note that the actions defined within each XVC are coded in e, and the ADK FRBM and XTSM System test vectors are coded in ASCII text format.

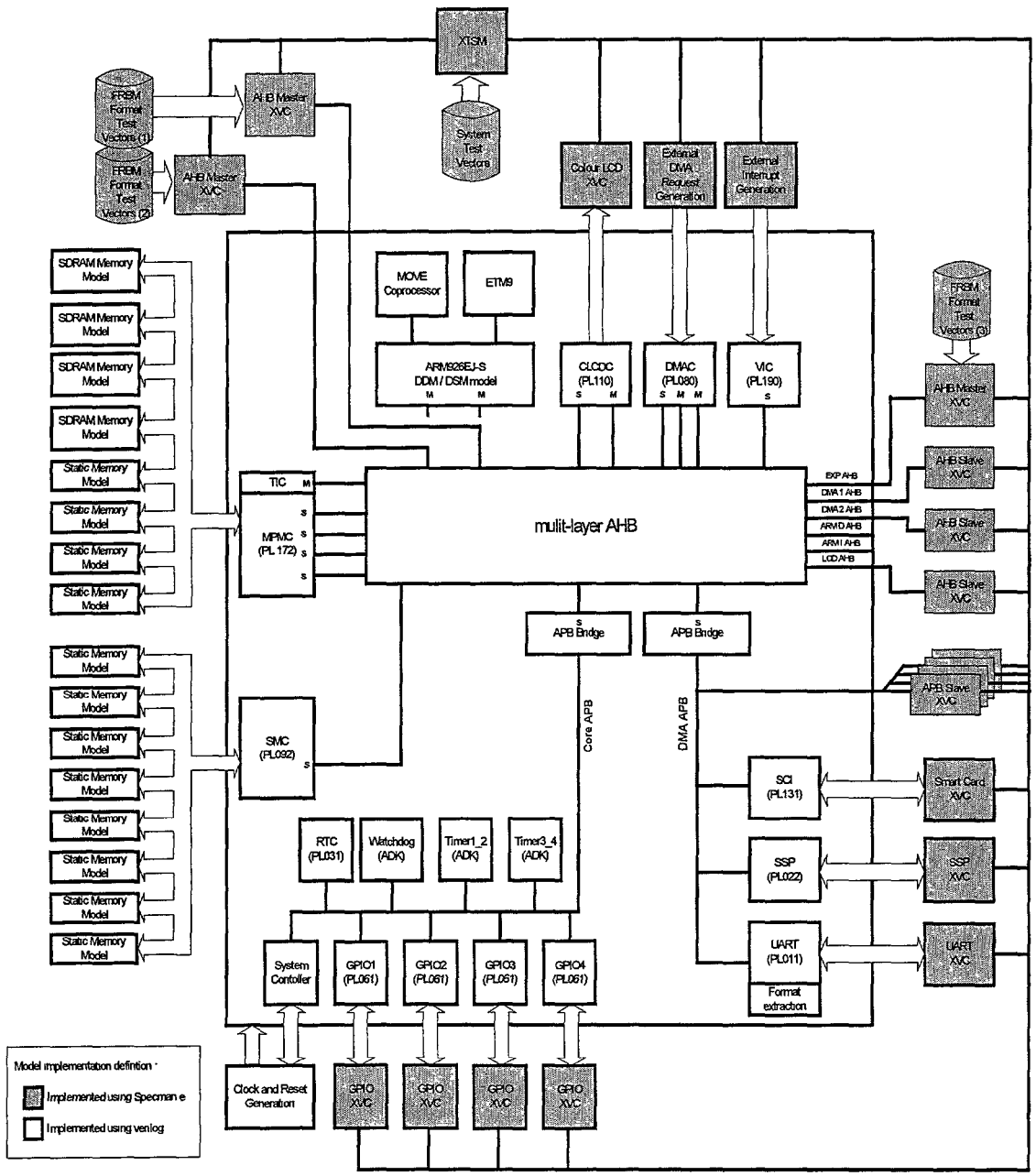

*Figure 13: System Testbench – BFM/External model test scenario manager view*

1.1.1.23 AHB Master XVC stimulus format

```
W Address|r0..r4 Data [Size] [Burst] [Prot] [Select]
R Address|r0..r4 Data [Mask] [Size] [Burst] [Prot] [Select]
S Data [Mask]
B
I [Address] [Dir] [Size] [Burst] [Prot] [Select]
P Address Data [Mask] [Size] [INCR|SINGLE] [Prot] [Select]
L Number
M Num_cycles [Addr_Low Addr_High]
C "Simulation Comment"
```

1.1.1.24 XTSM stimulus format

```
E Event
O [Target Number [S|E] [Num_cycles]] | Num_cycles
T Event [E|D] [S|C] [Wait_event]
D Number
A Target Number Data [Mask] [E Event]
X Number [Event]
@ Event
F Event
```

1.1.1.25 AHB Master XVC stimulus command description (as FRBM)

W The write command starts a write burst and may be followed by a number of S vectors
R The read command starts a read burst and may be followed by a number of S vectors
S The Sequential vector provides data for the remaining beats in a burst. The testbench is responsible for calculating the address required
B The Busy vector inserts a Busy transfer in the middle of a burst
I The Idle command performs an Idle transfer
P The Poll command performs a read transfer which repeats until the data matches the required value. The Poll vector can only be used for INCR or SINGLE burst types
L The Loop command repeats the last command a number of times. In AHB, if a loop command follows a W or R command then it is only legal for the burst type to be INCR or SINGLE
M The Memory test command causes the testbench to generate random transfers in the address range (from Addr_Low to Addr_High). The testbench should only generate read transfers from addresses that it has previously written to, so that expected read data is always known
C The Comment command prints out a message to the simulation window

1.1.1.26 XTSM stimulus command description

E Define an event ID, must be followed by either a P or a F command. Events are disabled by default
O Event options, specifies which target action fires the event on starting or ending (default is E), followed by an optional delay; or fires after a given number of cycles
T Toggle event activation E for enable, D for disable (default), optionally the toggle command is executed on an event. The optional S and C parameters determine whether or not the event is to be fired as single shot (S) or continuous (C -- default). For single shot events, they automatically toggle to disabled after firing.
D Define a scenario and assign it an ID number. Must be followed by a sequence of A commands
A Execute Action from a Target XVC with optional parameters, does not execute but adds to the D command list. The E parameter specifies that the action can only start after an event has fired
X Start executing a scenario identified by ID, optionally start after a target event ID has completed
@ Wait until a specified event is fired
F Fire a specified event number

1.1.1.26.1 AHB Master XVC and XTSM stimulus command parameters used

[event] A 32 bit value used to identify an STSM event. Any events generated from the XTSM or XVCs will need to map to these event identifiers

[cycles] A cycle is taken from the rising edge of the clock input signal to the XTSM

[Target] A 32 bit value identifier. Target Ids are unique identifiers for XVCs; it is recommended that a target Id matches the decoder memory map for slaves, and either a HMASTER value or a sequential numeric values for masters

[Number] A 32 bit value identifier

[Data] A 32 bit value

[Mask] A 32 bit value that will be bitwise ANDed with [Data] values

1.1.1.26.2 The E,O and T commands

The E command specifies an event ID that may be fired; either a P or an O command must then follow this. When The E command specifies an event ID that may be fired; either a P or an O command must then follow this. When followed by a P (poll) command the event fires when the P condition is satisfied. When followed by an O (event options) command, the event fires after the conditions specified by the O command are met (i.e. an XVC action completing followed by an optional cycle delay, or just a cycle delay). The default firing of the event from a target XVC action is on action completion, this can be modified for the event to fire as a target action is started.

A cycle is taken from the rising edge of the clock input signal to the EBFM.

Any event remains idle until the T command is used to enable the event. The T command has a number of optional parameters, designed to give maximum flexibility to when and how events are fired. For example if a scenario required a delay before starting, then an event could be defined thus:

```
E 1         // Define event 1
O 256       // Event 1 fires after a delay of 256 cycles
T 1 E S     // Toggle event 1 to enabled, single shot
X 2 1       // Execute scenario 2 after event 1 has fired
```

Here scenario 2 would be executed after event 1. Event 1 was defined as a delay of 256 cycles, and then enabled as a single shot event before the scenario was started.

1.1.1.26.3 The D,A and X commands

In the same way that the E command defines an event, the D command defines a scenario. The scenario is a list commands that are to be played as an execution thread from the EBFM. Actions to be executed on each of the XVCs can be queued as entries after the D command. Multiple actions for a single XVC will be queued and executed sequentially.

When an X command is initiated, the initial actions for each XVC are started simultaneously. Actions can only be sequenced by using events e.g.:

```
E 1                        // Define event 1
O 0x82000000 1 E           // Event 1 fires when XVC 0x82000000 ends
action 1
T 1 E S                    // Enable event 1, single shot
D 1                        // Define scenario 1
A 0x82000000 1 0x0         // Do XVC 0x82000000, action 1
A 0x84000000 1 0x0 E 1     // Do XVC 0x84000000, action 1 only when
event 1 fires
A 0x82000000 2 0x0         // Do XVC 0x82000000, action 2 after action 1
```

1.1.1.26.4 The @ and F commands

Once a scenario has been started; which may be suspended if an optional trigger event is specified, control returns to the next stimulus vector immediately following the X command that initiated the scenario. If the next vector itself is an X command then an error is generated, as this would imply that simultaneous scenarios are required. Simultaneous scenarios are currently outside the scope of FSPM.

In order to interact with a scenario once it has been started, the @ command is used to wait for an event to fire. The F command is used to fire an event without the need for it to be enabled. This provides the facility for actions to wait until the EBFM is ready to continue. A typical example of this would be to define a scenario with an action to start on event x, however the EBFM may need to perform some set-up reads/writes to certain peripherals before it can monitor the progress of the action. The stimulus file would include an F <x> command after setup to cause the action to start executing.

1.1.1.26.5 Interrupt and DMA request latency

As the EBFM is cycle based, there should be sufficient time to poll the VIC or DMA status registers to determine if an IRQ/FIQ or DMA request had occurred. Alternatively it may also be possible to build in two internal events into each XVC to register an IRQ or a DMA request. These may be assigned default action identifiers such that IRQ/DMA detection events could be set up and caught with an @ command.

1.1.1.26.6 Command Timeouts

The P (poll), and @ (wait on event) commands will have an arbitrary number of cycles implicit timeout before the simulation run is halted. This is primarily to prevent excessive CPU resource usage, for example during over-night batch runs.

1.1.1.26.7 AHB Master XVC Block diagram

The AHB XVC would interface with an AHB bus as a bus master device as shown in figure 14 below. Note the two non-AMBA signals for IRQ and FIQ input on the AHB Master XVC, these are useful should the XVC need to represent a core model:

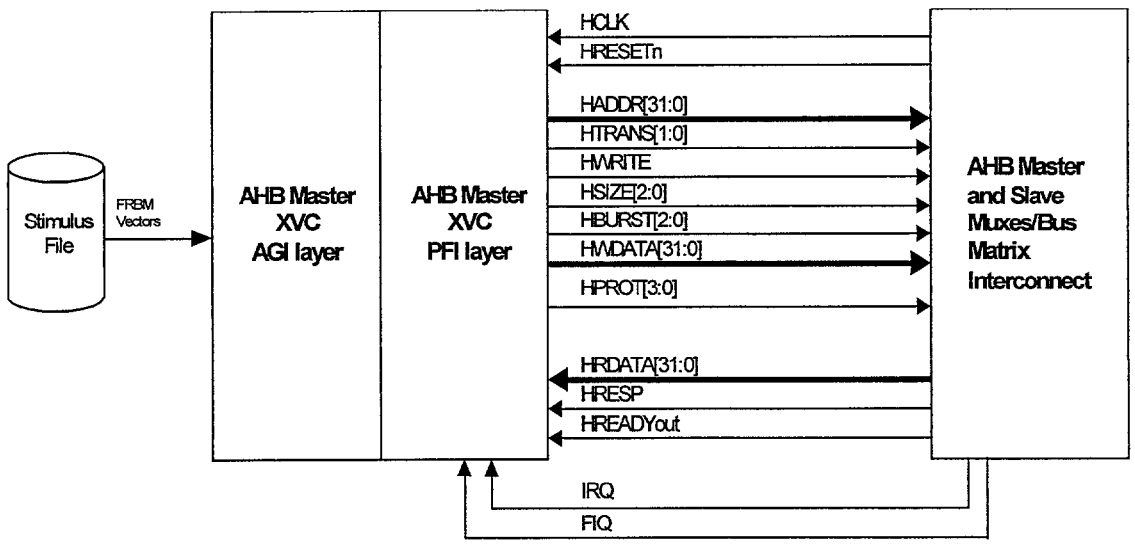

*Figure 14: AHB Master XVC block diagram interfacing to an AHB bus*

1.1.1.27 Example Top level Specman code for an AHB Master XVC

The code section below demonstrates an example to level implementation of an AHB Master XVC where the input file is optionally parsed at post-generation. In normal operation i.e. when read_input is called and parse_input is false, an FRBM input structure is returned. This input structure is in turn passed as transfers to an ahb_master driving method in the PFI via a transaction interface. Note that the pin_driver implementation of an AHB Master XVC is basically a BIM.

```
<'
//-----------------------------------------------------------------------
// XVC: AHB Master External Verification Component Declaration
//-----------------------------------------------------------------------
// Imports
//-----------------------------------------------------------------------
import XVC_base;
//-----------------------------------------------------------------------
// Extend base Struct for CORE XVC
//-----------------------------------------------------------------------
extend CORE XVC {
    parse_input: bool;
       keep parse_input == fsp_config.parse_input;
    input_file: string;
       keep input_file == fsp_config.input_file;
    !input_vector : FRBM_Input;
    // Support methods
    read_input(parse_only: bool, file:string):FRBM_Input is empty;
    // Check input file
    post_generate() is also {if (parse_input) {input_vector = read_input(parse_input,
input_file);};// post_generate()
 };// CORE XVC
//-----------------------------------------------------------------------
// Extend base Struct for CORE PFI
//-----------------------------------------------------------------------
extend CORE XVC_pin_driver {
    smp : CORE_signal_map;
       keep smp == get_enclosing_unit(XVC).fsp_config.core_smp;
    event hclk is change('(smp.AHB_HCLK)') @sim;      // Main clock
    event hclk_r is {@hclk_r; [2]} @hclk;              // Rising-edge clock
    event reset is fall('(smp.AHB_HRESET)') @hclk_r;  // Bus reset
    AHB_master_driver()@hclk_r is empty;
    // Start main TCM
    run() is also {start AHB_master_driver();};
    // Support methods
    W(addr:ahb_addr_t, data:ahb_data_t, mask:ahb_data_t,
       size:ahb_size_t, burst:ahb_burst_t, prot:ahb_prot_t, sel:ahb_sel_t) is empty;
    R(addr:ahb_addr_t, data:ahb_data_t, mask:ahb_data_t,
       size:ahb_size_t, burst:ahb_burst_t, prot:ahb_prot_t, sel:ahb_sel_t) is empty;
    S(data:ahb_data_t, mask:ahb_data_t) is empty;
    //...
};// CORE XVC_pin_driver extend CORE XVC_transaction_driver {
    W(addr:ahb_addr_t, data:ahb_data_t, mask:ahb_data_t,
       size:ahb_size_t, burst:ahb_burst_t, prot:ahb_prot_t, sel:ahb_sel_t) is empty;
    R(addr:ahb_addr_t, data:ahb_data_t, mask:ahb_data_t,
       size:ahb_size_t, burst:ahb_burst_t, prot:ahb_prot_t, sel:ahb_sel_t) is empty;
    S(data:ahb_data_t, mask:ahb_data_t) is empty;
    //...
};// CORE XVC_transaction_driver
```

```
extend CORE XVC_transaction_interface {
    // Pin driver implementation
    when RTL_level XVC {
        W(addr:ahb_addr_t, data:ahb_data_t, mask:ahb_data_t,
          size:ahb_size_t, burst:ahb_burst_t, prot:ahb_prot_t, sel:ahb_sel_t) is {
            pin_driver.W(addr, data, mask, size, burst, prot, sel);
        };// W
        R(addr:ahb_addr_t, data:ahb_data_t, mask:ahb_data_t,
          size:ahb_size_t, burst:ahb_burst_t, prot:ahb_prot_t, sel:ahb_sel_t) is {;
            pin_driver.R(addr, data, mask, size, burst, prot, sel);
        };// R
        S(data:ahb_data_t, mask:ahb_data_t) is {
            pin_driver.S(data, mask);
        };// S
        //...
    };// RTL_level
    // Transaction level implementation
    when FALSE'RTL_level XVC {
        W(addr:ahb_addr_t, data:ahb_data_t, mask:ahb_data_t,
          size:ahb_size_t, burst:ahb_burst_t, prot:ahb_prot_t, sel:ahb_sel_t) is {
            transaction_driver.W(addr, data, mask, size, burst, prot, sel);
        };// W
        R(addr:ahb_addr_t, data:ahb_data_t, mask:ahb_data_t,
          size:ahb_size_t, burst:ahb_burst_t, prot:ahb_prot_t, sel:ahb_sel_t) is {;
            transaction_driver.R(addr, data, mask, size, burst, prot, sel);
        };// R
        S(data:ahb_data_t, mask:ahb_data_t) is {
            transaction_driver.S(data, mask);
        };// S
        //...
    };// FALSE RTL_level
};// CORE XVC_transaction_interface //---------------------------------------------------------------
// Extend base Struct for CORE AGI
//---------------------------------------------------------------
extend CORE XVC_AGI {
    //---------------------------------------------------------------
    // Action Sequences
    //---------------------------------------------------------------
    execute_action(idAction:int, action_data: XVC_action_data) is only {
        event_info : XVC_Event_Info;
        case idAction {
            1: {
                // Write to trans_if for I/O using either published API above or file reader support functions
                // Generate Events back to XTSM using p_xtsm.queue_event(event_info);
                //...
            };// Action 1
            default: {};
        };// case idAction
    };// execute_action
};// CORE XVC_AGI
'>
```

General extension of XVCs by users

When developing XVC extensions, the base class must always be used as a starting point for each XVC. Both the PFI and the AGI must be clearly documented in that:

- The PFI must have its API published such that the AGI can easily call routines published here to define lists of actions for it's XVC. In the example given above, the API for the PFI is essentially the FRBM command set.

- The AGI must have its action list published such that it is clear what the result of each action ID is.

System Scenario Specification

The mechanics of specifying a system scenario are partly described in section 3.5.2 above. This section shows at the highest level how XVC modules can interact with a bus master to emulate the workings of an operating system accessing devices that may be generating multiple and simultaneous interrupts to a cycle level resolution.

However this approach relies on tightly coupled XVC action integration with the vectors specified in the stimulus file. It is true to say that the stimulus file vectors represent what would be the operating system driver interface with the hardware itself.

It is intended therefore that a system stimulus file along with sets of actions in each XVC provide a library of functionality that attempts to emulate hardware/software device interaction. It is only when these 'libraries' are combined that truly useful system scenarios can be specified.

Groups of libraries can in this way be used to capture the every-day operation of a range of features that the FSP target will be expected to perform. The art in effective FSP validation then is to develop the ability to select such an appropriate set of scenarios given a requested target system implementation.

Until such time that this process can be automated, it is recommended that the system architect work closely with the end-customer at the requirements capture phase to identify which features can be mapped onto a validation world.

Top Level Environment

1.1.1.28 Example Top level Specman code for a FSP_env

Sections 3.5.1 and 3.5.2 define two discrete e modules. These modules are instantiated and integrated together in a FSP environment top level module. Tasks expected of this module will include: internal to external event mapping; output annotation message request processing; error logging and reporting, and system coverage.

```
<'
define FSP_CONTAINER      sys;
extend fsp_name:          [WPS=0];
'>
<'
//------------------------------------------------------------------
// FSP Top level environment
//------------------------------------------------------------------
unit FSP_env {
    name: FSP_name;
    fsp_config: FSP_config;
    fsp_status: FSP_master_status;
    RTL_level: bool;
      keep RTL_level == fsp_config.RTL_level;
    xtsm: XTSM is instance;              // External test scenario manager
      keep xtsm.name       == FSP_name;
      keep xtsm.RTL_level  == RTL_level;
      keep xtsm.FSP_config == fsp_config;
    syscov: FSP_coverage is instance;    // System Coverage object
      keep syscov.name       == FSP_name;
      keep syscov.FSP_config == fsp_config;

// Main Support methods
    fsp_main() is empty;
    read_fsp_config() is empty;
    define_event(ebfm_event: EBFM_event) is empty;
    define_scenario(ebfm_scenario: EBFM_scenario) is empty;

// Facilitate communications between XTSM and XVCs
    handle_XTSM_event(xtsm_event: XTSM_event) is empty;

// Get configuration and start main processing loop
    pre_generate() is also {read_fsp_config();};  // pre_generate()
    run() is also {start fsp_main()};              // run()
};// FSP_env
'>
<'
//------------------------------------------------------------------
// Instantiate FSP Top level environment in FSP_CONTAINER
//------------------------------------------------------------------
extend FSP_CONTAINER {
    arm_fsp: WPS FSP_env is instance;    // Instantiate top level unit
};// FSP_CONTAINER
'>
```

1.1.1.29 Example system validation environment user configuration file

When running a system validation test, the top level module that instantiates it requires a user configuration file to handle signal mapping, and any other configuration parameters that may be required. The configuration file will be called FSP.cfg and will use a defacto 'ini' file format:

```
//---------------------------------------------------------------
//  FSP Configuration File
//---------------------------------------------------------------
[XTSM]
HDLPATH=~/top
HCLK=HCLK
HRESET=HRESETn
VECTORS=system_vecs.vec

[XVC]
HDLPATH=~/top/core
TARGET_ID=0x52000000
HRDATA=HRDATAin              ; Signals from AMBA bus
HREADY=HREADYin
HRESP=HRESPin
HGRANT=HGRANTcore
HADDR=HADDRout               ; Signals to AMBA bus
HTRANS=HTRANSout
HWRITE=HWRITEout
HSIZE=HSIZE
HBURST=HBURST
HPROT=HPROT
HWDATA=HWDATAout
HBUSREQ=HBUSREQcore
HLOCK=HLOCKcore
HCLK=HCLK
HRESET=HRESETn
IRQ=IRQin
FIQ=FIQin
VECTORS=frbm_vecs1.vec
NAME="Core AHB Master External Model"
TYPE=CORE

[XVC]
HDLPATH=~/top/fsp/clcd
TARGET_ID=0x8E000000
CLLP=CLLPclcd    // Line pulse signal        from Timing Controller
CLCP=CLCPclcd    // Clock input              from MUX / Panel clock generator
CLFP=CLFPclcd    // Frame pulse signal       from Timing Controller
CLAC=CLACclcd    // AC Bias(STN)/Data Enable(TFT)  from Timing Controller
CLD=CLDclcd      // Panel data [23:0]        from MUX
CLLE=CLLEclcd    // Line end signal          from Timing Controller
NAME="CLCD External Model"
TYPE=CLCD ; Peripheral type determines signal map used by XVC

[General]
RTL_LEVEL=TRUE
STOP_ON_ERROR=TRUE
LOG_FILE=report.txt
LOGGING=TRUE
```

System Level Coverage & Scoreboarding

This is a function of the top level environment (section 3.5.4), which instantiates a coverage struct that collects events passing between the XTSM and EBFM, and crosses them with the master status stored in fsp_status. A coverage report output at the end of the FSP validation process should include the following items:

- IRQ/FIQs raised and serviced
- DMA requests raised and serviced
- Scenarios completed
- Address Map coverage Ideally Fabric Coverage: e.g. Arbitration/Muxing fairness, maximum bandwidth under load would also be incuded, however this may require a dedicated 'fabric monitor' module that collects coverage for these components.

The score-boarding mechanism will be implemented via the XTSM in that the XTSM serves as a central scoreboard data repository. Using pack and unpack constructs

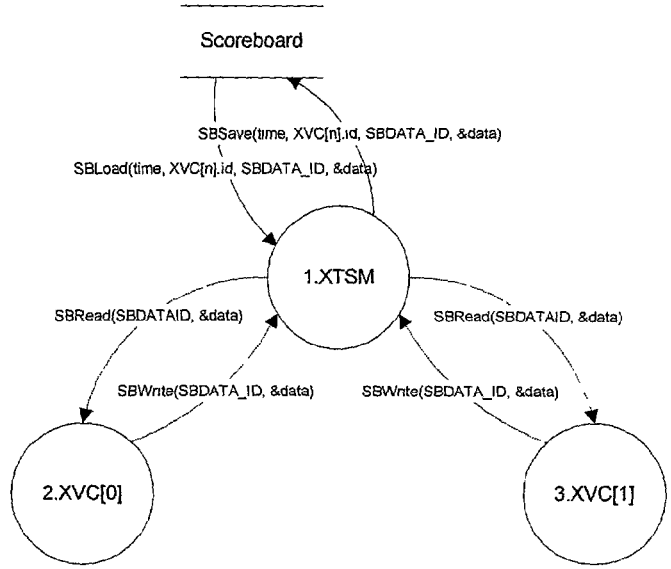

Figure 13: XTSM score-boarding support

Linking in existing RTL Models

Addition of RTL models to the base FSP is catered for both by the extensible nature of the integration test environment (section 3.3) and the system verification environment (section 3.4). When linking into the system validation environment however (section 3.5), without a corresponding XVC, there can be no test scenario integration of the RTL. The EBFM will still be able to read and drive the RTL if it is a memory-mapped slave, but there can be no action sequence invocation.

In the case of an RTL slave, an external RTL model will be required to drive and read external stimulus. In the case of an RTL master, a suitable stimulus file would be required.

One possibility for integrating an RTL model would be to provide a template XVC with sufficient integration documentation, but this would require a degree of expertise to link in the model efficiently.

$3^{rd}$ Party Test Environment Integration

There is no reason why a third-party environment cannot be integrated into a FSP verification environment, especially if the environment is in RTL. Indeed the Modelsim Simulator supports both mixed VHDL and Verilog simulations. The same limitations apply however as in section 3.5.6 for system level validation.

Any simulator can be chosen that is also supported by the Specman Elite Tool. One important note however with Specman is that an invisible Specman $3^{rd}$ party component cannot be linked in to a Specman Elite testbench as both require different Specman kernels (which cannot run concurrently). This issue can be resolved however by running the invisible Specman sources in a Specman Elite environment.

Verification & Validation environment Deliverable Composition

As one of the features of delivering a FSP is it's ability to be extended, then the same requirements must hold for the verification and validation environments. An extra degree of support and re-use documentation is therefore required on top of the standard deliverables.

Integration Testing

The customer requires the following deliverables:

- PMAP Documentation and Template Configuration Guide
- Supporting Perl Scripts including installation notes
- Example PMAP templates and peripherals_list including a makefile
- ADK FRBM Installation and users guide
- Vector format description and useage documentation
- RTL external model Installation and users guide
- RTL external model extension and re-use guide
- Example test environment with sample vector files

System Verification

The customer requires the following deliverables:

- Integration testing kit 3.7.1 (FRBM component not required)
- Boot code configuration manual
- Test Code structure and overview document including API guide
- Test Code example module for adding user test modules
- Test Code object modules (may supply sources depending on contract) and header files
- XVC Specman models, including user and installation guide
- XVC Example module for adding external test modules (for running in default directed test mode)
- Example test environment with test Code executing API calls to test drivers

System Validation

The customer requires the following deliverables:

- System validation methodology overview document
- EBFM Installation and Programmers guide
- Coverage Analysis guide and example code
- XVC Specman models, including user and installation guide
- XVC Example module for adding external test modules (for running in scenario test mode)
- Example test environment running an example scenario Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

I claim:

1. Apparatus for simulating data processing operations performed by a data processing apparatus, said apparatus comprising:
    a hardware simulator responsive to one or more stimulus signals to generate one or more response signals simulating a response of said data processing apparatus to said one or more stimulus signals if applied to said data processing apparatus;
    a plurality of signal interface controllers coupled to said hardware simulator, each signal interface controller serving to perform one or more simulation actions transferring at least one of one or more stimulus signals and one or more response signals between a corresponding portion of said hardware simulator and said signal interface controller as part of simulating said data processing operations;
    a test scenario manager coupled to said plurality of signal interface controllers and operable to transfer test scenario controlling messages to said plurality of signal interface controllers, at least one of said test scenario controlling messages including:
    (i) data defining a simulation action to be performed by a signal interface controller; and
    (ii) data defining when said signal interface controller should perform said simulated action; and
    a time generator coupled to said plurality of signal interface controllers and said test scenario manager for generating messages specifying time defining events corresponding to advancement of simulated time for said hardware simulator,
    wherein said test scenario manager includes a shared data memory into which a signal interface controller may store data using a test scenario controlling message sent from said signal interface controller to said test scenario manager via said shared data memory independently of advancement of simulated time by said messages specifying time defining events, said data being readable from said shared data memory by another signal interface controller.

2. Apparatus as claimed in claim 1, wherein said data defining when said signal interface controller should perform said simulated action includes at least one of:
    (i) a time value;
    (ii) a delay value; and
    (iii) a value specifying said simulated action should be performed when a specified event is simulated as occurring.

3. Apparatus as claimed in claim 1, wherein a first signal interface controller is responsive to simulation results captured by a second signal interface controller, written to said shared data memory by said second signal interface controller and then read from said shared data memory by said first signal interface controller.

4. Apparatus as claimed in claim 1, wherein said hardware simulation is simulated using software running upon a general purpose computer.

5. Apparatus as claimed in claim 1, wherein each signal interface controller includes an action queue of simulation actions to be performed by said signal interface controller.

6. Apparatus as claimed in claim 5, wherein each signal interface controller includes a test scenario manager interface operable to exchange test scenario controlling messages with said test scenario manager and to add simulation actions to said action queue.

7. Apparatus as claimed in claim 5, wherein each signal interface controller includes a peripheral interface operable to transform simulation actions specified in said action queue into signal values exchanged with said hardware simulation.

8. Apparatus as claimed in claim 1, wherein test scenario manager sends a machine generated sequence of simulation actions to said plurality of signal interface controllers to perform random simulation testing of said data processing apparatus.

9. Apparatus as claimed in claim 1, wherein said test scenario manager is operable as a master device and said plurality of signal interface controllers are operable as slave devices to said master device.

10. A method of simulating data processing operations performed by a data processing apparatus, said method comprising the steps of:
    in response to one or more stimulus signals, using a hardware simulator to generate one or more response signals simulating a response of said data processing apparatus to said one or more stimulus signals if applied to said data processing apparatus;
    performing in each of a plurality of signal interface controllers coupled to said hardware simulator one or more simulation actions transferring at least one of one or more stimulus signals and one or more response signals between a corresponding portion of said hardware simulator and said signal interface controller as part of simulating said data processing operations; and
    transferring test scenario controlling messages from a test scenario manager to said plurality of signal interface controllers, at least one of said test scenario controlling messages including:
    (i) data defining a simulation action to be performed by a signal interface controller; and
    (ii) data defining when said signal interface controller should perform said simulated action; and
    generating messages specifying time defining events corresponding to advancement of simulated time for said hardware simulator,
    wherein said test scenario manager includes a shared data memory into which a signal interface controller may store data using a test scenario controlling message sent from said signal interface controller to said test scenario manager, said data being readable from said shared data memory by another signal interface controller,
        whereby said test scenario controlling messages are communicated via said shared data memory independently of advancement of simulated time by said messages specifying time defining events.

11. A method as claimed in claim 10, wherein said data defining when said signal interface controller should perform said simulated action includes at least one of:
    (i) a time value;
    (ii) a delay value; and
    (iii) a value specifying said simulated action should be performed when a specified event is simulated as occurring.

12. A method as claimed in claim 10, wherein a first signal interface controller is responsive to simulation results captured by a second signal interface controller, written to said shared data memory by said second signal interface controller and then read from said shared data memory by said first signal interface controller.

13. A method as claimed in claim 10, wherein said hardware simulation is simulated using software running upon a general purpose computer.

14. A method as claimed in claim 10, wherein each signal interface controller includes an action queue of simulation actions to be performed by said signal interface controller.

15. A method as claimed in claim 14, wherein each signal interface controller includes a test scenario manager interface operable to exchange test scenario controlling messages with said test scenario manager and to add simulation actions to said action queue.

16. A method as claimed in claim 14, wherein each signal interface controller includes a peripheral interface operable to transform simulation actions specified in said action queue into signal values exchanged with said hardware simulation.

17. A method as claimed in claim 10, wherein test scenario manager sends a machine generated sequence of simulation actions to said plurality of signal interface controllers to perform random simulation testing of said data processing apparatus.

18. A method as claimed in claim 10, wherein said test scenario manager is operable as a master device and said plurality of signal interface controllers are operable as slave devices to said master device.

19. A computer program product embodied on a computer-readable medium and comprising code that when executed controls a computer to simulate data processing operations performed by a data processing apparatus, said computer program product comprising:
   hardware simulator code responsive to one or more stimulus signals to generate one or more response signals simulating a response of said data processing apparatus to said one or more stimulus signals if applied to said data processing apparatus;
   a plurality of signal interface controller code blocks coupled to said hardware simulator code, each signal interface controller code block serving to perform one or more simulation actions transferring at least one of one or more stimulus signals and one or more response signals between a corresponding portion of said hardware simulator code and said signal interface controller code block as part of simulating said data processing operations; and
   test scenario manager code coupled to said plurality of signal interface controller code blocks and operable to transfer test scenario controlling messages to said plurality of signal interface controller code blocks, at least one of said test scenario controlling messages including:
   (i) data defining a simulation action to be performed by a signal interface controller code block; and
   (ii) data defining when said signal interface controller code block should perform said simulated action; and
   time generator code coupled to said plurality of signal interface controller blocks and said test scenario manager code for generating messages specifying time defining events corresponding to advancement of simulated time for said hardware simulatorcode,
   wherein said test scenario manager code provides a shared data memory into which a signal interface controller code block may store data using a test scenario controlling message sent from said signal interface controller code block to said test scenario manager code, said data being readable from said shared data memory by another signal interface controller code block,
   whereby said test scenario controlling messages are communicated via said shared data memory independently of advancement of simulated time by said messages specifying time defining events.

20. A computer program product as claimed in claim 19, wherein said data defining when said signal interface controller code block should perform said simulated action includes at least one of:
   (i) a time value;
   (ii) a delay value; and
   (iii) a value specifying said simulated action should be performed when a specified event is simulated as occurring.

21. A computer program product as claimed in claim 19, wherein a first signal interface controller code block is responsive to simulation results captured by a second signal interface controller code block, written to said shared data memory by said second signal interface controller code block and then read from said shared data memory by said first signal interface controller code block.

22. A computer program product as claimed in claim 19, wherein said hardware simulation is simulated using software running upon a general purpose computer.

23. A computer program product as claimed in claim 19, wherein each signal interface controller code block includes an action queue of simulation actions to be performed by said signal interface controller code block.

24. A computer program product as claimed in claim 23, wherein each signal interface controller code block includes a test scenario manager interface operable to exchange test scenario controlling messages with said test scenario manager code and to add simulation actions to said action queue.

25. A computer program product as claimed in claim 23, wherein each signal interface controller code block includes a peripheral interface operable to transform simulation actions specified in said action queue into signal values exchanged with said hardware simulation code.

26. A computer program product as claimed in claim 19, wherein test scenario manager code sends a machine generated sequence of simulation actions to said plurality of signal interface controller code blocks to perform random simulation testing of said data processing apparatus.

27. A computer program product as claimed in claim 19, wherein said test scenario manager code is operable as a master device and said plurality of signal interface controller code blocks are operable as slave devices to said master device.

\* \* \* \* \*